United States Patent
Asghari et al.

(10) Patent No.: US 11,782,134 B2
(45) Date of Patent: Oct. 10, 2023

(54) OPTICAL MANIFOLD FOR LIDAR APPLICATIONS

(71) Applicant: SiLC Technologies, Inc., Monrovia, CA (US)

(72) Inventors: Mehdi Asghari, La Canada Flintridge, CA (US); Dazeng Feng, El Monte, CA (US); Bradley Jonathan Luff, La Canada Flintridge, CA (US); Majid Boloorian, San Diego, CA (US)

(73) Assignee: SiLC Technologies, Inc., Monrovia, CA (US)

( * ) Notice: Subject to any disclaimer, the term of this patent is extended or adjusted under 35 U.S.C. 154(b) by 682 days.

(21) Appl. No.: 16/689,057

(22) Filed: Nov. 19, 2019

(65) Prior Publication Data

US 2020/0158830 A1    May 21, 2020

Related U.S. Application Data

(60) Provisional application No. 62/770,415, filed on Nov. 21, 2018.

(51) Int. Cl.
*G01S 7/48* (2006.01)
*G01S 7/481* (2006.01)
(Continued)

(52) U.S. Cl.
CPC ............ *G01S 7/4817* (2013.01); *G01S 7/484* (2013.01); *G01S 7/4813* (2013.01); *H03K 3/00* (2013.01)

(58) Field of Classification Search
USPC ...................................................... 356/4.01
See application file for complete search history.

(56) References Cited

U.S. PATENT DOCUMENTS 9,157,790 B2    10/2015   Shpunt et al.
9,823,118 B2 *  11/2017   Doylend ................. G01S 17/10
(Continued)

FOREIGN PATENT DOCUMENTS

CN         107 976 666 A    5/2018
WO         2018/003852 A1   1/2018

OTHER PUBLICATIONS

Copenheaver, Blaine R., International Search Report and Written Opinion, PCT/US2019/062306, United States Patent and Trademark Office, Feb. 12, 2020.
(Continued)

*Primary Examiner* — James R Hulka
(74) *Attorney, Agent, or Firm* — Gavrilovich, Dodd & Lindsey LLP

(57) ABSTRACT

The optical manifold has multiple cores that each generates an outgoing LIDAR signal that carries one or more channels. Scanning heads are located apart from the manifold. Each scanning head is associated with one of the cores and is configured such that each scanning head receives an outgoing LIDAR signal from the associated core. The scanning heads are each configured to transmit one or more LIDAR output signals that each carries light from a different one of the channels and such that the different LIDAR output signals each travels away from the scanning head in a different direction. Each of the cores is associated with different core electronics. The core electronics are configured to tune a property of one of the outgoing LIDAR signals such that the tuning of the property causes a change to the direction that the one or more LIDAR output signals travel away from the scanning head associated with the core electronics.

20 Claims, 10 Drawing Sheets

(51) Int. Cl.
*G01S 7/484* (2006.01)
*H03K 3/00* (2006.01)

(56) References Cited

U.S. PATENT DOCUMENTS

| | | | | |
|---|---|---|---|---|
| 10,137,903 | B2* | 11/2018 | Tascione | G05D 1/0061 |
| 10,274,599 | B2* | 4/2019 | Schmalenberg | G01S 7/4817 |
| 10,397,019 | B2* | 8/2019 | Hartung | G05D 1/0077 |
| 10,761,195 | B2* | 9/2020 | Donovan | G01S 17/10 |
| 10,788,582 | B2* | 9/2020 | Feng | G01S 7/4818 |
| 11,300,683 | B2* | 4/2022 | Bao | G01S 7/4865 |
| 2013/0206967 | A1* | 8/2013 | Shpunt | G01S 17/42 |
| | | | | 359/619 |
| 2016/0341818 | A1* | 11/2016 | Gilliland | H04N 13/25 |
| 2016/0377721 | A1 | 12/2016 | Lardin et al. | |
| 2017/0139411 | A1 | 5/2017 | Hartung et al. | |
| 2017/0184450 | A1 | 6/2017 | Doylend et al. | |
| 2017/0307736 | A1 | 10/2017 | Donovan | |
| 2017/0350965 | A1 | 12/2017 | Schmalenberg | |
| 2018/0024232 | A1* | 1/2018 | Gilliland | G01S 17/931 |
| | | | | 348/48 |
| 2018/0050704 | A1 | 2/2018 | Tascione et al. | |
| 2018/0188371 | A1 | 7/2018 | Bao et al. | |
| 2019/0204419 | A1* | 7/2019 | Baba | G02B 6/124 |
| 2019/0346568 | A1 | 11/2019 | Feng et al. | |

OTHER PUBLICATIONS

Baghmisheh, B. B., "Chip-scale Lidar" University of California, Berkeley, Jan. 19, 2017, Technical Report No. UCB/EECS-2017-4, http://www2.eecs.berkeley.edu/Pubs/TechRpts/2017/EECS-2017-4.html.

Issakov, V. (2010). Radar Systems, Ch. 2. In Microwave Circuits for 24GHz Automotive Radar in Silicon-based Technologies. Berlin Heidelberg: Springer-Verlag.

Li, L. (2014). Time-of-Flight Camera—An Introduction. TI Technical White Paper SLOA190B.

PDB450C—Switchable Gain Balanced Amp. Photodetector, InGaAs. (n.d.). Retrieved from Thorlabs: https://www.thorlabs.com/thorproduct.cfm?partnumber=PDB450C, 2018.

Damp, Stephan, Extended European Search Report, Application No. 19886443.1, European Patent Office, dated Jul. 1, 2022.

* cited by examiner

OPTICAL MANIFOLD FOR LIDAR APPLICATIONS

RELATED APPLICATIONS

This application claims the benefit of U.S. Provisional Patent Application Ser. No. 62/770,415, filed on Nov. 21, 2018, entitled "Optical Manifold for LIDAR Applications," and incorporated herein in its entirety.

FIELD

The invention relates to optical devices. In particular, the invention relates to LIDAR chips.

BACKGROUND

LIDAR (Light Detection and Ranging) sensors are used to construct a 3D image of a target scene by illuminating the scene with a LIDAR output signal and measuring the properties of the reflected LIDAR input signal. Frequency Modulated Continuous Wave (FMCW) is an example of a coherent detection method can be used for LIDAR applications. FMCW techniques have shown a reduced sensitivity to ambient light and light from other LIDAR systems.

The LIDAR systems are being adapted to increasingly complex applications such as ADAS (Advanced Driver Assistance Systems) and AR (Augmented Reality). However, LIDAR systems that provide the levels of reliability, flexibility, and maintainability needed for commercial adoption have not yet been introduced. As a result, there is a need for an improved LIDAR system.

SUMMARY

A LIDAR system includes an optical manifold with multiple cores that each generates an outgoing LIDAR signal that carries one or more channels. The system also includes scanning heads located apart from the optical manifold. Each scanning head is associated with one of the cores and is configured such that each scanning head receives an outgoing LIDAR signal from the associated core. The scanning heads are each configured to transmit one or more LIDAR output signals that each includes light from a different one of the channels and such that the different LIDAR output signals each travels away from the scanning head in a different direction. Each of the cores is associated with different core electronics. The core electronics are configured to tune a property of one of the outgoing LIDAR signals such that the tuning of the property causes a change to the direction that the one or more LIDAR output signals travel away from the scanning head associated with the core electronics.

A LIDAR system includes an optical manifold with a housing in which are positioned multiple cores that each generates an outgoing LIDAR signal that carries one or more channels. The system also includes scanning heads located apart from the optical manifold. The scanning heads are each associated with one of the cores. The scanning heads are configured such that each scanning head receives an outgoing LIDAR signal from the associated core. The scanning heads are configured to transmit one or more LIDAR output signals that includes light from a different one of the channels. The LIDAR output signals are transmitted such that the different LIDAR output signals each travels away from the scanning head in a different direction. The cores are each included on a different core card. One of the core cards is a first core card that is connected to a first connector in the housing. A second core card can be located outside of the housing but is configured to be connected to the first connector. The second core card is configured to generate an outgoing LIDAR signal that carries one or more second channels with different optical properties from one or more channels in the outgoing LIDAR signal generated by the first core.

A method of operating an optical manifold includes placing multiple cores in an interior of an optical manifold housing. The cores are each configured to generate an outgoing LIDAR signal that carries one or more channels. Each of the cores is associated with a scanning head located apart from the optical manifold. The scanning heads are configured such that each scanning head receives an outgoing LIDAR signal from the associated core. One of the cores is a first core. The method also includes replacing the first core with a second core. The second core is configured to generate an outgoing LIDAR signal that carries one or more second channels with different optical properties from one or more channels in the outgoing LIDAR signal generated by the first core.

BRIEF DESCRIPTION OF THE FIGURES

FIG. 4A illustrates suitable optical components for use in the LIDAR system of FIG. 3.

FIG. 4B is a schematic of suitable electrical components for use in the LIDAR system of FIG. 3.

FIG. 7A is a topview of the scanning head.

FIG. 7B is a topview of another embodiment of the scanning head.

DESCRIPTION

A LIDAR system includes a manifold and multiple scanning heads. The manifold can hold multiple LIDAR core cards that each generates an outgoing LIDAR signal that carries one or more different channels. Different scanning heads can receive an outgoing LIDAR signal from different LIDAR core cards. The scanning heads can each be configured to output one or more LIDAR output signals that each includes light from the outgoing LIDAR signal that was received by the scanning head.

The LIDAR core cards can alter the properties of the outgoing LIDAR signals such that the direction that the LIDAR output signals travel away from the LIDAR system changes. The LIDAR core cards can use this change in direction to scan the LIDAR output signals to multiple different sample regions in a field of view. Additionally, the LIDAR core cards can include electronics that employ light from the LIDAR output signals to generate LIDAR data (radial velocity and/or distance between a reflecting object and the LIDAR system) for each of the sample regions. The manifold that contains these LIDAR core cards can be located remotely from all or a portion of the scanning heads. Since the components on the LIDAR core cards can be the least robust components of the LIDAR system, positioning of the manifold remotely from the scanning heads allows the less robust components of the LIDAR system to be located in a secure location. For instance, the manifold and LIDAR core cards can be in a location that is protected from a variety of atmospheric influences such as weather. The ability to place the sensitive components of the LIDAR system in a secure location improves the reliability of the LIDAR system.

The manifold can be constructed such that the LIDAR core cards can be easily replaced with other LIDAR core cards. This replacement can be done in response to a failure or malfunction of a LIDAR core card. As a result, the interchangeability of the LIDAR core cards makes the LIDAR system easy to maintain over time. Additionally or alternately, the various components of the LIDAR system can be divided between the manifold and the scanning heads such that a replacement LIDAR core card can have different functionality that the prior LIDAR core card while still operating with the same scanning heads. For instance, the replacement LIDAR core card can generate an outgoing LIDAR signal that carries a different number of channels, channels with different wavelengths, and/or channels with different waveforms. The ability to easily exchange the LIDAR core cards increases the flexibility of the LIDAR system.

Figure 1:
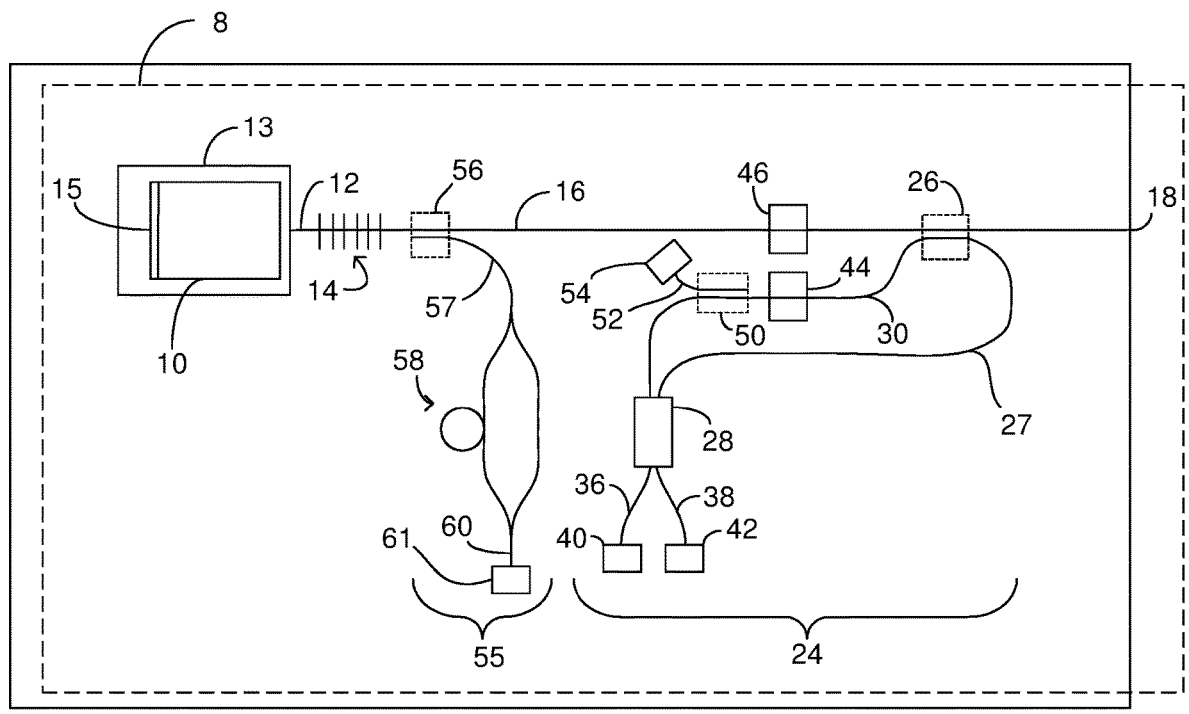
FIG. 1 is a topview of a LIDAR system with a LIDAR chip that includes a component assembly with a laser cavity.

FIG. 1 is a topview of a LIDAR system with a LIDAR chip that includes a component assembly 8 with a laser cavity. The laser cavity includes a light source 10 that can include or consist of a gain medium (not shown) for a laser. The chip also includes a cavity waveguide 12 that receives a light signal from the light source 10. The light source can be positioned in a recess 13 so a facet of the light source is optically aligned with a facet of the cavity waveguide 12 to allow the light source and cavity waveguide 12 to exchange light signals. The cavity waveguide 12 carries the light signal to a partial return device 14. The illustrated partial return device 14 is an optical grating such as a Bragg grating. However, other partial return devices 14 can be used; for instance, mirrors can be used in conjunction with echelle gratings and arrayed waveguide gratings.

The partial return device 14 returns a return portion of the light signal to the cavity waveguide 12 as a return signal. For instance, the cavity waveguide 12 returns the return signal to the light source 10 such that the return portion of the light signal travels through the gain medium. The light source 10 is configured such that at least a portion of the return signal is added to the light signal that is received at the cavity waveguide 12. For instance, the light source 10 can include a highly, fully, or partially reflective device 15 that reflects the return signal received from the gain medium back into the gain medium. As a result, light can resonate between the partial return device 14 and the reflective device 15 so as to form a Distributed Bragg Reflector (DBR) laser cavity. A DBR laser cavity has an inherently narrow-linewidth and a longer coherence length than DFB lasers and accordingly improves performance when an object reflecting the LIDAR output signal from the chip is located further away from the chip.

The partial return device 14 passes a portion of the light signal received from the cavity waveguide 12 to a utility waveguide 16 included on the chip. The portion of the light signal that the utility waveguide 16 receives from the partial return device 14 serves as the output of the laser cavity. The output of the laser cavity serves as an outgoing LIDAR signal on the utility waveguide 16. The utility waveguide 16 terminates at a facet 18 and carries the outgoing LIDAR signal to the facet 18. The facet 18 can be positioned such that the outgoing LIDAR signal traveling through the facet 18 exits the chip and serves as a LIDAR output signal. For instance, the facet 18 can be positioned at an edge of the chip so the outgoing LIDAR signal traveling through the facet 18 exits the chip and serves as a LIDAR output signal.

The LIDAR output signal travels away from the chip and is reflected by objects in the path of the LIDAR signal. The reflected signal travels away from the objects. At least a portion of the reflected signal returns to the facet 18 of the utility waveguide 16. Accordingly, a portion of the reflected signal can enter the utility waveguide 16 through the facet 18 and serve as a LIDAR input signal guided by the utility waveguide 16.

The chip includes a data branch 24 where the optical signals that are processed for LIDAR data are generated. The data branch includes an optical coupler 26 that moves a portion of the light signals from the utility waveguide 16 into the data branch. For instance, an optical coupler 26 couples a portion of the outgoing LIDAR signal from the utility waveguide 16 onto a reference waveguide 27 as a reference signal. The reference waveguide 27 carries the reference signal to a light-combining component 28.

The optical coupler 26 also couples a portion of the LIDAR input signal from the utility waveguide 16 onto a comparative waveguide 30 as a comparative signal. The comparative signal includes at least a portion of the light from the LIDAR input signal. The comparative signal can exclude light from the reference light signal. The comparative waveguide 30 carries the comparative signal to the light-combining component 28.

The illustrated optical coupler 26 is a result of positioning the utility waveguide 16 sufficiently close to the reference waveguide 27 and the comparative waveguide 30 that light from the utility waveguide 16 is coupled into the reference waveguide 27 and the comparative waveguide 30; however, other signal tapping components can be used to move a portion of the of the light signals from the utility waveguide 16 onto the reference waveguide 27 and the comparative waveguide 30. Examples of suitable signal tapping components include, but are not limited to, y-junctions, multi-mode interference couplers (MMIs), and integrated optical circulators.

The light-combining component 28 combines the comparative signal and the reference signal into a composite signal. The reference signal includes light from the outgoing LIDAR signal. For instance, the reference signal can serve as a sample of the outgoing LIDAR signal. The reference signal can exclude light from the LIDAR output signal and the LIDAR input signal. In contrast, the comparative signal light includes light from the LIDAR input signal. For instance, the comparative signal can serve as a sample of the LIDAR input signal. Accordingly, the comparative signal has been reflected by an object located off the chip while the LIDAR output signal has not been reflected. When the chip and the reflecting object are moving relative to one another, the comparative signal and the reference signal have different frequencies due to the Doppler effect. As a result, beating occurs between the comparative signal and the reference signal.

The light-combining component 28 also splits the resulting composite sample signal onto a first detector waveguide 36 and a second detector waveguide 38. The first detector waveguide 36 carries a first portion of the composite sample signal to a first light sensor 40 that converts the first portion of the composite sample signal to a first electrical signal. The second detector waveguide 38 carries a second portion of the composite sample signal to a second light sensor 42 that converts the second portion of the composite sample signal to a second electrical signal. Examples of suitable light sensors include germanium photodiodes (PDs), and avalanche photodiodes (APDs).

The light-combining component 28, the first light sensor 40 and the second light sensor 42 can be connected as a balanced photodetector that outputs an electrical data signal. For instance, the light-combining component 28, the first light sensor 40 and the second light sensor 42 can be connected such that the DC components of the signal photocurrents cancel, improving detection sensitivity. Suitable methods for connecting the first light sensor 40 and the second light sensor 42 as balanced photodetectors include connecting the first light sensor 40 and the second light sensor 42 in series. In one example, the first light sensor 40 and the second light sensor 42 are both avalanche photodiodes connected in series. Balanced photodetection is desirable for detection of small signal fluctuations.

An example of a suitable light-combining component 28 is a Multi-Mode Interference (MMI) device such as a 2×2 MMI device. Other suitable light-combining components 28 include, but are not limited to, adiabatic splitters, and directional coupler. In some instances, the functions of the illustrated light-combining component 28 are performed by more than one optical component or a combination of optical components.

A single light sensor can replace the first light sensor 40 and the second light sensor 42 and can output the data signal. When a single light sensor replaces the first light sensor 40 and the second light sensor 42, the light-combining component 28 need not include light-splitting functionality. As a result, the illustrated light light-combining component 28 can be a 2×1 light-combining component rather than the illustrated 2×1 light-combining component. For instance, the illustrated light light-combining component can be a 2×1 MMI device. In these instances, the chip includes a single detector waveguide that carries the composite sample signal to the light sensor.

The data branch includes a data optical attenuator 44 positioned along the comparative waveguide 30 such that the data optical attenuator 44 can be operated so as to attenuate the comparative signal on the comparative waveguide 30. The chip also includes an output optical attenuator 46 positioned along the utility waveguide 16 such that the output optical attenuator 46 can be operated so as to attenuate the outgoing LIDAR signal on the utility waveguide 16. Suitable attenuators for the data optical attenuator 44 and/or the output optical attenuator 46 are configured to attenuate intensity of a light signal. Examples of a suitable attenuator configured to attenuate intensity of a light signal include carrier injection based PIN diodes, electro-absorption modulators, and Mach-Zehnder (MZ) modulators.

The chip also includes a sampling directional coupler 50 that couples a portion of the comparative signal from the comparative waveguide 30 onto a sampling waveguide 52. The coupled portion of the comparative signal serves as a sampling signal. The sampling waveguide 52 carries the sampling signal to a sampling light sensor 54. Although FIG. 1 illustrates a sampling directional coupler 50 moving a portion of the comparative signal onto the sampling waveguide 52, other signal tapping components can be used to move a portion of the comparative signal from the comparative waveguide 30 onto the sampling waveguide 52. Examples of suitable signal tapping components include, but are not limited to, y-junctions, and MMIs.

The chip includes a control branch 55 for controlling operation of the laser cavity. The control branch includes a directional coupler 56 that moves a portion of the outgoing LIDAR signal from the utility waveguide 16 onto a control waveguide 57. The coupled portion of the outgoing LIDAR signal serves as a tapped signal. Although FIG. 1 illustrates a directional coupler 56 moving a portion of the outgoing LIDAR signal onto the control waveguide 57, other signal-tapping components can be used to move a portion of the outgoing LIDAR signal from the utility waveguide 16 onto the control waveguide 57. Examples of suitable signal tapping components include, but are not limited to, y-junctions, and MMIs.

The control waveguide 57 carries the tapped signal to an interferometer 58 that splits the tapped signal and then re-combines the different portions of the tapped signal with a phase differential between the portions of the tapped signal. The illustrated interferometer 58 is a Mach-Zehnder interferometer; however, other interferometers can be used.

The interferometer 58 outputs a control light signal on an interferometer waveguide 60. The interferometer waveguide 60 carries the control light signal to a control light sensor 61 that converts the control light signal to an electrical signal that serves as an electrical control signal. The interferometer signal has an intensity that is a function of the frequency of the outgoing LIDAR signal. For instance, a Mach-Zehnder interferometer will output a sinusoidal control light signal with a fringe pattern. Changes to the frequency of the outgoing lidar signal will cause changes to the frequency of the control light signal. Accordingly, the frequency of the electrical control signal output from the control light sensor 61 is a function of the frequency of the outgoing lidar signal. Other detection mechanisms can be used in place of the control light sensor 61. For instance, the control light sensor 61 can be replaced with a balanced photodetector arranged as the light combining component 28, the first light sensor 40 and the second light sensor 42.

Electronics 62 can operate one or more components on the chip. For instance, the electronics 62 can be in electrical communication with and control operation of the light source 10, the data optical attenuator 44, output optical attenuator 46, the first light sensor 40, the second light sensor 42, the sampling light sensor 54, and the control light sensor 61. Although the electronics 62 are shown off the chip, all or a portion of the electronics can be included on the chip. For instance, the chip can include electrical conductors that connect the first light sensor 40 in series with the second light sensor 42.

During operation of the chip, the electronics 62 operate the light source 10 such that the laser cavity outputs the outgoing LIDAR signal. The electronics 62 then operate the chip through a series of cycles where each cycle generates LIDAR data (radial velocity and/or distance between a reflecting object and the LIDAR chip) for a sample region in a filed of view. During each cycle, the data signal is sampled multiple times. During each of the samples, the electronics tune the frequency of the outgoing LIDAR signal. As will be described in more detail below, the electronics can employ output from the control branch in order to control the frequency of the outgoing LIDAR signal such that the frequency of the outgoing LIDAR signal as a function of time is known to the electronics. In some instance, a cycle includes multiple periods. For instance, a cycle can include a first period and a second period. During the first period, the electronics 62 can increase the frequency of the outgoing LIDAR signal and during a second period the electronics 62 can decrease the frequency of the outgoing LIDAR signal. In some instances, the increase is linear and the decrease is linear. For instance, the laser cavity can be configured to output an outgoing LIDAR signal (and accordingly a LIDAR output signal) with a wavelength of 1550 nm. During the first period, the electronics 62 can increase the frequency of the outgoing LIDAR signal (and accordingly a LIDAR output signal) such that the wavelength decreases from 1550 nm to 1459.98 nm followed by decreasing the frequency of the outgoing LIDAR signal such that the wavelength increases from 1459.98 nm to 1550 nm.

When the outgoing LIDAR signal frequency is increased during the first period, the LIDAR output signal travels away from the chip and then returns to the chip as a LIDAR input signal. A portion of the LIDAR input signal becomes the comparative signal. During the time that the LIDAR output signal and the LIDAR input signal are traveling between the chip and a reflecting object, the frequency of the outgoing LIDAR signal continues to increase. Since a portion of the outgoing LIDAR signal becomes the reference signal, the frequency of the reference signal continues to increase. As a result, the comparative signal enters the light-combining component with a lower frequency than the reference signal concurrently entering the light-combining component. Additionally, the further the reflecting object is located from the chip, the more the frequency of the reference signal increases before the LIDAR input signal returns to the chip. Accordingly, the larger the difference between the frequency of the comparative signal and the frequency of the reference signal, the further the reflecting object is from the chip. As a result, the difference between the frequency of the comparative signal and the frequency of the reference signal is a function of the distance between the chip and the reflecting object.

For the same reasons, when the outgoing LIDAR signal frequency is decreased during the second period, the comparative signal enters the light-combining component with a higher frequency than the reference signal concurrently entering the light-combining component and the difference between the frequency of the comparative signal and the frequency of the reference signal during the second period is also function of the distance between the chip and the reflecting object.

In some instances, the difference between the frequency of the comparative signal and the frequency of the reference signal can also be a function of the Doppler effect because relative movement of the chip and reflecting object can also affect the frequency of the comparative signal. For instance, when the chip is moving toward or away from the reflecting object and/or the reflecting object is moving toward or away from the chip, the Doppler effect can affect the frequency of the comparative signal. Since the frequency of the comparative signal is a function of the speed the reflecting object is moving toward or away from the chip and/or the speed the chip is moving toward or away from the reflecting object, the difference between the frequency of the comparative signal and the frequency of the reference signal is also a function of the speed the reflecting object is moving toward or away from the chip and/or the speed the chip is moving toward or away from the reflecting object. Accordingly, the difference between the frequency of the comparative signal and the frequency of the reference signal is a function of the distance between the chip and the reflecting object and is also a function of the Doppler effect.

The composite sample signal and the data signal each effectively compares the comparative signal and the reference signal. For instance, since the light-combining component combines the comparative signal and the reference signal and these signals have different frequencies, there is beating between the comparative signal and reference signal. Accordingly, the composite sample signal and the data signal have a beat frequency related to the frequency difference between the comparative signal and the reference signal and the beat frequency can be used to determine the difference in the frequency of the comparative signal and the reference signal. A higher beat frequency for the composite sample signal and/or the data signal indicates a higher differential between the frequencies of the comparative signal and the reference signal. As a result, the beat frequency of the data signal is a function of the distance between the chip and the reflecting object and is also a function of the Doppler effect.

As noted above, the beat frequency is a function of two unknowns; the distance between the chip and the reflecting object and the relative velocity of the chip and the reflecting object (i.e., the contribution of the Doppler effect). The change in the frequency difference between the comparative signal and the reference signal ($\Delta f$) is given by $\Delta f = 2\Delta v f/c$ where f is the frequency of the LIDAR output signal and accordingly the reference signal, $\Delta v$ is the relative velocity of the chip and the reflecting object and c is the speed of light in air. The use of multiple different samples permits the electronics 62 to resolve the two unknowns. For instance, the beat frequency determined for the first period is related to the unknown distance and Doppler contribution and the beat frequency determined for the second period is also related to the unknown distance and Doppler contribution. The availability of the two relationships allows the electronics 62 to resolve the two unknowns. Accordingly, the distance between the chip and the reflecting object can be determined without influence from the Doppler effect. Further, in some instances, the electronics 62 use this distance in combination with the Doppler effect to determine the velocity of the reflecting object toward or away from the chip.

In instances where the relative velocity of target and source is zero or very small, the contribution of the Doppler effect to the beat frequency is essentially zero. In these instances, the Doppler effect does not make a substantial contribution to the beat frequency and the electronics 62 can take only the first period to determine the distance between the chip and the reflecting object.

During operation, the electronics 62 can adjust the frequency of the outgoing LIDAR signal in response to the electrical control signal output from the control light sensor 61. As noted above, the magnitude of the electrical control signal output from the control light sensor 61 is a function of the frequency of the outgoing LIDAR signal. Accordingly, the electronics 62 can adjust the frequency of the outgoing LIDAR signal in response to the magnitude of the control signal. For instance, while changing the frequency of the outgoing LIDAR signal during one of the samples, the electronics 62 can have a range of suitable values for the electrical control signal magnitude as a function of time. At multiple different times during a sample, the electronics 62 can compare the electrical control signal magnitude to the range of values associated with the current time in the sample. If the electrical control signal magnitude indicates that the frequency of the outgoing LIDAR signal is outside the associated range of electrical control signal magnitudes, the electronics 62 can operate the light source 10 so as to change the frequency of the outgoing LIDAR signal so it falls within the associated range. If the electrical control signal magnitude indicates that the frequency of the outgoing LIDAR signal is within the associated range of electrical control signal magnitudes, the electronics 62 do not change the frequency of the outgoing LIDAR signal.

During operation, the electronics 62 can adjust the level of attenuation provided by the output optical attenuator 46 in response to the sampling signal from the sampling light sensor 54. For instance, the electronics 62 operate the output optical attenuator 46 so as to increase the level of attenuation in response to the magnitude of the sampling signal being above a first signal threshold and/or decrease the magnitude of the power drop in response to the magnitude of the sampling signal being below a second signal threshold.

In some instances, the electronics 62 adjust the level of attenuation provided by the output optical attenuator 46 to prevent or reduce the effects of back-reflection on the performance of the laser cavity. For instance, the first signal threshold and/or the second signal threshold can optionally be selected to prevent or reduce the effects of back-reflection on the performance of the laser cavity. Back reflection occurs when a portion of the LIDAR input signal returns to the laser cavity as a returned LIDAR signal. In some instances, on the order of 50% of the LIDAR input signal that passes through the facet 18 returns to the laser cavity. The returned LIDAR signal can affect performance of the laser cavity when the power of the returned LIDAR signal entering the partial return device 14 does not decrease below the power of the outgoing LIDAR signal exiting from the partial return device 14 ("power drop") by more than a minimum power drop threshold. In the illustrated chip, the minimum power drop threshold can be around 35 dB (0.03%). Accordingly, the returned lidar signal can affect the performance of the laser cavity when the power of the returned LIDAR signal entering the partial return device 14 is not more than 35 dB below the power of the outgoing LIDAR signal exiting from the partial return device 14.

The electronics 62 can operate the output optical attenuator 46 so as to reduce the effect of low power drops, e.g. when the target object is very close or highly reflective or both. As is evident from FIG. 1, operation of the output optical attenuator 46 so as to increase the level of attenuation reduces the power of the returned LIDAR signal entering the partial return device 14 and also reduces the power of the returned outgoing LIDAR signal at a location away from the partial return device 14. Since the output optical attenuator 46 is located apart from the partial return device 14, the power of the outgoing LIDAR signal exiting from the partial return device 14 is not directly affected by the operation of the output optical attenuator 46. Accordingly, the operation of the output optical attenuator 46 so as to increase the level of attenuation increases the level of the power drop. As a result, the electronics can employ the optical attenuator 46 so as to tune the power drop.

Additionally, the magnitude of the sampling signal is related to the power drop. For instance, the magnitude of the sampling signal is related to the power of the comparative signal as is evident from FIG. 1. Since the comparative signal is a portion of the lidar input signal, the magnitude of the sampling signal is related to the power of the lidar input signal. This result means the magnitude of the sampling signal is also related to the power of the returned LIDAR signal because the returned LIDAR signal is a portion of the lidar input signal. Accordingly, the magnitude of the sampling signal is related to the power drop.

Since the magnitude of the sampling signal is related to the power drop, the electronics 62 can use the magnitude of the sampling signal to operate the output optical attenuator so as to keep the magnitude of the comparative signal power within a target range. For instance, the electronics 62 can operate the output optical attenuator 46 so as to increase the magnitude of the power drop in response to the sampling signal indicating that the magnitude of power drop is at or below a first threshold and/or the electronics 62 can operate the output optical attenuator 46 so as to decrease the magnitude of the power drop in response to the sampling signal indicating that the magnitude of power drop is at or above a second threshold. In some instances, the first threshold is greater than or equal to the minimum power drop threshold. In one example, the electronics 62 operate the output optical attenuator 46 so as to increase the magnitude of the power drop in response to the magnitude of the sampling signal being above a first signal threshold and/or decrease the magnitude of the power drop in response to the magnitude of the sampling signal being below a second signal threshold. The identification of the value(s) for one, two, three, or four variables selected from the group consisting of the first threshold, the second threshold, the first signal threshold, and the second signal threshold can be determined from calibration of the optical chip during set-up of the LIDAR chip system.

Light sensors can become saturated when the power of the composite light signal exceeds a power threshold. When a light sensor becomes saturated, the magnitude of the data signal hits a maximum value that does not increase despite additional increases in the power of the composite light signal above the power threshold. Accordingly, data can be lost when the power of the composite light signal exceeds a power threshold. During operation, the electronics 62 can adjust the level of attenuation provided by the data optical attenuator 44 so the power of the composite light signal is maintained below a power threshold.

As is evident from FIG. 1, the magnitude of the sampling signal is related to the power of the comparative signal. Accordingly, the electronics 62 can operate the data optical attenuator 44 in response to output from the sampling signal. For instance, the electronics 62 can operate the data optical attenuator so as to increase attenuation of the comparative signal when the magnitude of the sampling signal indicates the power of the comparative signal is above an upper comparative signal threshold and/or can operate the data optical attenuator so as to decrease attenuation of the comparative signal when the magnitude of the sampling signal indicates the power of the comparative signal is below a lower comparative signal threshold. For instance, in some instances, the electronics 62 can increase attenuation of the comparative signal when the magnitude of the sampling signal is at or above an upper comparative threshold and/or the electronics 62 decrease attenuation of the comparative signal when the magnitude of the sampling signal is at or below an upper comparative signal threshold.

Figure 2:
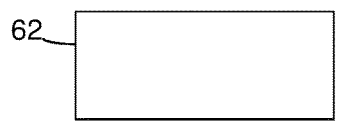
FIG. 2 is a cross-section of portion of a chip constructed from a silicon-on-insulator wafer.
Figure 2:
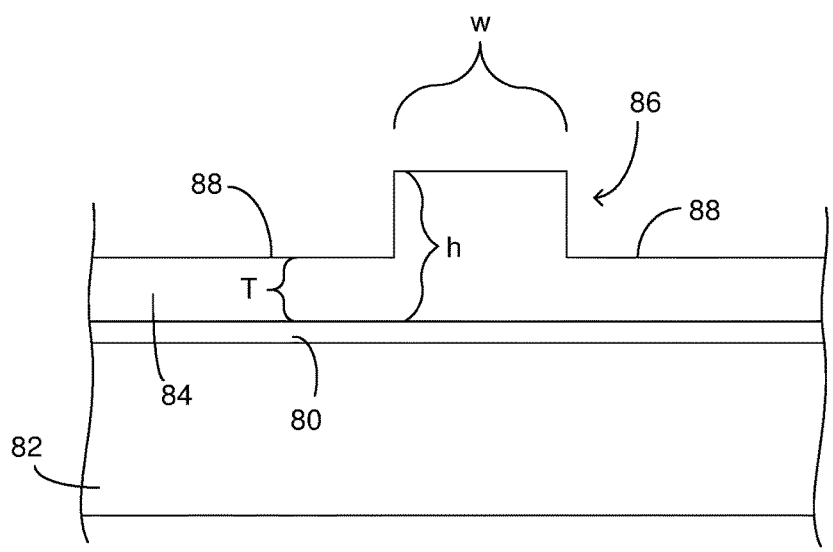

As noted above, the electronics 62 can adjust the level of attenuation provided by the output optical attenuator 46 in response to the sampling signal. The electronics 62 can adjust the level of attenuation provided by the data optical attenuator 44 in response to the sampling signal in addition or as an alternative to adjusting the level of attenuation provided by the output optical attenuator 46 in response to the sampling signal Suitable platforms for the chip include, but are not limited to, silica, indium phosphide, and silicon-on-insulator wafers. FIG. 2 is a cross-section of portion of a chip constructed from a silicon-on-insulator wafer. A silicon-on-insulator (SOI) wafer includes a buried layer 80 between a substrate 82 and a light-transmitting medium 84. In a silicon-on-insulator wafer, the buried layer is silica while the substrate and the light-transmitting medium are silicon. The substrate of an optical platform such as an SOI wafer can serve as the base for the entire chip. For instance, the optical components shown in FIG. 1 can be positioned on or over the top and/or lateral sides of the substrate.

The portion of the chip illustrated in FIG. 2 includes a waveguide construction that is suitable for use with chips constructed from silicon-on-insulator wafers. A ridge 86 of the light-transmitting medium extends away from slab regions 88 of the light-transmitting medium. The light signals are constrained between the top of the ridge and the buried oxide layer.

The dimensions of the ridge waveguide are labeled in FIG. 2. For instance, the ridge has a width labeled w and a height labeled h. A thickness of the slab regions is labeled T. For LIDAR applications, these dimensions are more important than other applications because of the need to use higher levels of optical power than are used in other applications. The ridge width (labeled w) is greater than 1 μm and less than 4 μm, the ridge height (labeled h) is greater than 1 μm and less than 4 μm, the slab region thickness is greater than 0.5 μm and less than 3 μm. These dimensions can apply to straight or substantially straight portions of the waveguide, curved portions of the waveguide and tapered portions of the waveguide(s). Accordingly, these portions of the waveguide will be single mode. However, in some instances, these dimensions apply to straight or substantially straight portions of a waveguide while curved portions of the waveguide and/or tapered portions of the waveguide have dimensions outside of these ranges. For instance, the tapered portions of the utility waveguide 16 illustrated in FIG. 1 can have a width and/or height that is >4 μm and can be in a range of 4 μm to 12 μm. Additionally or alternately, curved portions of a waveguide can have a reduced slab thickness in order to reduce optical loss in the curved portions of the waveguide. For instance, a curved portion of a waveguide can have a ridge that extends away from a slab region with a thickness greater than or equal to 0.0 μm and less than 0.5 μm. While the above dimensions will generally provide the straight or substantially straight portions of a waveguide with a single-mode construction, they can result in the tapered section(s) and/or curved section(s) that are multi-mode. Coupling between the multi-mode geometry to the single mode geometry can be done using tapers that do not substantially excite the higher order modes. Accordingly, the waveguides can be constructed such that the signals carried in the waveguides are carried in a single mode even when carried in waveguide sections having multi-mode dimensions. The waveguide construction of FIG. 2 is suitable for all or a portion of the waveguides selected from the group consisting of the cavity waveguide 12, utility waveguide 16, reference waveguide 27, comparative waveguide 30, first detector waveguide 36, second detector waveguide 38, sampling waveguide 52, control waveguide 57, and interferometer waveguide 60.

The light source 10 that is interfaced with the utility waveguide 16 can be a gain element that is a component separate from the chip and then attached to the chip. For instance, the light source 10 can be a gain element that is attached to the chip using a flip-chip arrangement.

Use of flip-chip arrangements is suitable when the light source 10 is to be interfaced with a ridge waveguide on a chip constructed from silicon-on-insulator wafer. Examples of suitable interfaces between flip-chip gain elements and ridge waveguides on chips constructed from silicon-on-insulator wafer can be found in U.S. Pat. No. 9,705,278, issued on Jul. 11, 2017 and in U.S. Pat. No. 5,991,484 issued on Nov. 23 1999; each of which is incorporated herein in its entirety. The constructions are suitable for use as the light source 10. When the light source 10 is a gain element, the electronics 62 can change the frequency of the outgoing LIDAR signal by changing the level of electrical current applied to through the gain element.

The attenuators can be a component that is separate from the chip and then attached to the chip. For instance, the attenuator can be included on an attenuator chip that is attached to the chip in a flip-chip arrangement. The use of attenuator chips is suitable for all or a portion of the attenuators selected from the group consisting of the data attenuator and the control attenuator.

As an alternative to including an attenuator on a separate component, all or a portion of the attenuators can be integrated with the chip. For instance, examples of attenuators that are interfaced with ridge waveguides on a chip constructed from a silicon-on-insulator wafer can be found in U.S. Pat. No. 5,908,305, issued on Jun. 1, 1999; each of which is incorporated herein in its entirety. The use of attenuators that are integrated with the chip are suitable for all or a portion of the light sensors selected from the group consisting of the data attenuator and the control attenuator.

Light sensors that are interfaced with waveguides on a chip can be a component that is separate from the chip and then attached to the chip. For instance, the light sensor can be a photodiode, or an avalanche photodiode. Examples of suitable light sensor components include, but are not limited to, InGaAs PIN photodiodes manufactured by Hamamatsu located in Hamamatsu Ciy, Japan, or an InGaAs APD (Avalanche Photo Diode) manufactured by Hamamatsu located in Hamamatsu City, Japan. These light sensors can be centrally located on the chip as illustrated in FIG. 1. Alternately, all or a portion the waveguides that terminate at a light sensor can terminate at a facet 18 located at an edge of the chip and the light sensor can be attached to the edge of the chip over the facet 18 such that the light sensor receives light that passes through the facet 18. The use of light sensors that are a separate component from the chip is suitable for all or a portion of the light sensors selected from the group consisting of the first light sensor 40, the second light sensor 42, the sampling light sensor 54, and the control light sensor 61.

As an alternative to a light sensor that is a separate component, all or a portion of the light sensors can be integrated with the chip. For instance, examples of light sensors that are interfaced with ridge waveguides on a chip constructed from a silicon-on-insulator wafer can be found in Optics Express Vol. 15, No. 21, 13965-13971 (2007); U.S. Pat. No. 8,093,080, issued on Jan. 10, 2012; U.S. Pat. No. 8,242,432, issued Aug. 14, 2012; and U.S. Pat. No. 6,108, 472, issued on Aug. 22, 2000 each of which is incorporated herein in its entirety. The use of light sensors that are integrated with the chip are suitable for all or a portion of the light sensors selected from the group consisting of the first light sensor 40, the second light sensor 42, the sampling light sensor 54, and the control light sensor 61.

Construction of optical gratings that are integrated with a variety of optical device platforms are available. For instance, a Bragg grating can be formed in a ridge waveguides by forming grooves in the top of the ridge and/or in the later sides of the ridge.

Figure 3:
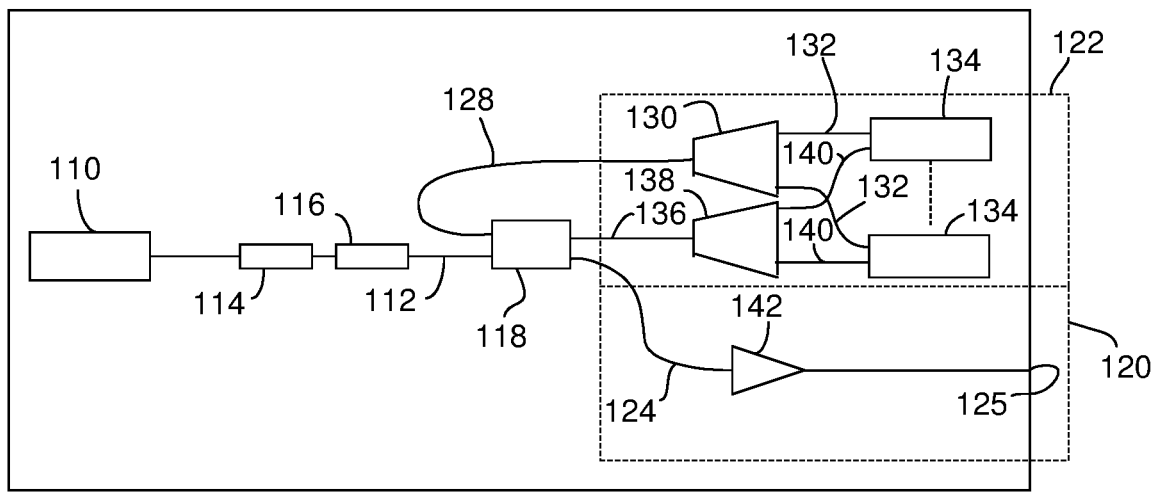
FIG. 3 is a schematic of a LIDAR system.

FIG. 3 is a schematic of a LIDAR system. The system includes a light source 110 such as a laser that outputs an outgoing light signal. The outgoing light signal includes multiple different channels that are each at a different wavelength. The wavelengths of the channels can be periodically spaced in that the wavelength increase from one channel to the next channel is constant or substantially constant. A suitable light source 110 for generating multiple channels with periodically spaced wavelengths includes, but is not limited to, comb lasers, multiple single wavelength lasers multiplexed into to single optical waveguide, sources such as that described in U.S. patent application Ser. No. 11/998,846, filed on Nov. 30, 2017, granted U.S. Pat. No. 7,542,641, entitled "Multi-Channel Optical Device," and incorporated herein in its entirety.

The LIDAR system also includes a utility waveguide 112 that receives an outgoing light signal from the light source 110. A modulator 114 is optionally positioned along the utility waveguide 112. The modulator 114 is configured to modulate the power of the outgoing light signal and accordingly the LIDAR output signal(s). The electronics can operate the modulator 114. Accordingly, the electronics can modulate the power of the outgoing LIDAR signal and accordingly the LIDAR output signal(s). Suitable modulators 114 include, but are not limited to, PIN diode carrier injection devices, Mach-Zehnder modulator devices, and electro-absorption modulator devices. When the modulator 114 is constructed on a silicon-on-insulator platform, a suitable modulator is disclosed in U.S. patent application Ser. No. 617,810, filed on Sep. 21, 1993, entitled Integrated Silicon PIN Diode Electro-Optic Waveguide, and incorporated herein in its entirety.

An amplifier 116 is optionally positioned along the utility waveguide 112. Since the power of the outgoing light signal is distributed among multiple channels, the amplifier 116 may be desirable to provide each of the channels with the desired power level on the utility waveguide 112. Suitable amplifiers include, but are not limited to, semiconductor optical amplifiers (SOAs).

The utility waveguide 112 carries the outgoing light signal from the modulator 114 to a signal-directing component 118. The signal-directing component 118 can direct the outgoing light signal to a LIDAR branch 120 and/or a data branch 122. The LIDAR branch outputs LIDAR output signals and receives LIDAR input signals. The data branch processes the LDAR input signals for the generation of LIDAR data (distance and/or radial velocity between the source of the LIDAR output signal and a reflecting object).

The LIDAR branch includes a LIDAR signal waveguide 124 that receives at least a portion of the outgoing light signal from the signal-directing component 118. The LIDAR signal waveguide 124 terminates at a facet 118 and carries the outgoing LIDAR signal to the facet 118. The facet 118 can be positioned such that the outgoing LIDAR signal traveling through the facet 118 exits the chip and serves as a transmitted LIDAR signal. For instance, the facet 118 can be positioned at an edge of the chip so an outgoing LIDAR signal traveling through the facet 118 exits the chip and serves as the transmitted LIDAR signal.

The transmitted LIDAR signal travels away from the chip and is reflected by objects in the path of the transmitted LIDAR signal. The reflected signal travels away from the objects. At least a portion of the reflected signal returns to the facet 118. Accordingly, a portion of the reflected signal can enter the LIDAR signal waveguide 124 through the facet 118 and serve as an incoming LIDAR signal guided by the LIDAR signal waveguide 124.

As will become evident below, the outgoing LIDAR signal and the transmitted LIDAR signal can include one or more LIDAR output signals that each corresponds to a different channel. Accordingly, the incoming LIDAR signal and the reflected signal can include one or more LIDAR input signals that each corresponds to a different channel.

The LIDAR signal waveguide 124 carries the incoming LIDAR signal to the signal-directing component 118. The signal-directing component 118 directs the incoming LIDAR signal to the utility waveguide 112 and/or a comparative signal waveguide 128. The portion of the incoming LIDAR signal-directed to the comparative signal waveguide 128 serves a comparative incoming LIDAR signal.

The comparative signal waveguide 128 carries the comparative incoming LIDAR signal to a comparative demultiplexer 130. When the comparative light signal includes multiple channels, the comparative demultiplexer 130 divides the comparative incoming LIDAR signal into different comparative signals that each has a different wavelength. The comparative demultiplexer 130 outputs the comparative signals on different comparative waveguides 132. The comparative waveguides 132 each carry one of the comparative signals to different processing components 134.

The signal-directing component 118 is configured such that when the signal-directing component 118 directs at least a portion of the incoming LIDAR signal to the comparative waveguide 132, the signal-directing component 118 also directs at least a portion of the outgoing light signal to a reference signal waveguide 136. The portion of the outgoing light signal received by the reference signal waveguide 136 serves as a reference light signal.

The reference signal waveguide 136 carries the reference light signal to a reference demultiplexer 138. When the reference light signal includes multiple channels, the reference demultiplexer 138 divides the reference light signal into different reference signals that each has a different wavelength. The reference demultiplexer 138 outputs the reference signals on different reference waveguides 140. The reference waveguides 140 each carry one of the reference signals to a different one of the processing components 134.

The comparative waveguides 132 and the reference waveguides 140 are configured such that a comparative signal and the corresponding reference signal are received at the same processing component 134. For instance, the comparative waveguides 132 and the reference waveguides 140 are configured such that the comparative signal and the corresponding reference signal of the same wavelength are received at the same processing component 134.

As will be described in more detail below, the processing components 134 each combines a comparative signal with the corresponding reference signal to form a composite signal that carries LIDAR data for a sample region on the field of view. Accordingly, the composite signal can be processed so as to extract LIDAR data for the sample region.

The signal-directing component 118 can be an optical coupler. When the signal-directing component 118 is an optical coupler, the signal-directing component 118 directs a first portion of the outgoing light signal to the LIDAR signal waveguide 124 and a second portion of the outgoing light signal to the reference signal waveguide 136 and also directs a first portion of the incoming LIDAR signal to the utility waveguide 112 and a second portion of the incoming LIDAR signal to the comparative signal waveguide 128. Accordingly, the second portion of the incoming LIDAR signal can serve as the comparative incoming LIDAR signal and the second portion of the outgoing light signal can serve as the reference light signal.

The signal-directing component 118 can be an optical switch such as a cross-over switch. A suitable cross-over switch can be operated in a cross mode or a pass mode. In the pass mode, the outgoing light signal is directed to the LIDAR signal waveguide 124 and an incoming LIDAR signal would be directed to the utility waveguide 112. In the cross mode, the outgoing light signal is directed to the reference signal waveguide 136 and the incoming LIDAR signal is directed to the comparative signal waveguide 128. Accordingly, the incoming LIDAR signal or a portion of the incoming LIDAR signal can serve as the comparative light signal and the outgoing light signal or a portion of the outgoing light signal can serve as the reference light signal.

An optical switch such as a cross-over switch can be controlled by the electronics. For instance, the electronics can control operate the switch such that the switch is in the cross mode or a pass mode. When the LIDAR output signal is to be transmitted from the LIDAR system, the electronics operate the switch such that the switch is in the pass mode. When the LIDAR input signal is to be received by the LIDAR system, the electronics operate the switch such that the switch is in the cross-over mode. The use of a switch can provide lower levels of optical loss than are associated with the use of an optical coupler as the signal-directing component 118.

In the above descriptions of the operation of the signal-directing component 118, the comparative light signals and the reference light signals are concurrently directed to the data branch. As a result, the processing components 134 can each combine a comparative signal with the corresponding reference signal.

In some instances, an optical amplifier 142 is optionally positioned along the LIDAR signal waveguide 124 and is configured to provide amplification of the outgoing light signal and/or of the incoming LIDAR signal. Accordingly, the effects of optical loss at the signal-directing component 118 can be reduced.

Light from a laser source is typically linearly polarized and hence the LIDAR output signal is also typically linearly polarized. Reflection from a target may change the angle of polarization of the returned light. Accordingly, the LIDAR input signal can include light if different linear polarities. For instance, a first portion of a LIDAR input signal can include light of a first linear polarity and a second portion of a LIDAR input signal can include light of a second linear polarity. The intensity of the resulting composite signals is proportional to the square of the cosine of the angle between the comparative and reference signal polarizations. If the angle is 90 degrees, the LIDAR data can be lost in the resulting composite signal. As a result, the LIDAR system can be modified to compensate for changes in polarity of the LIDAR output signal.

Figure 4A:
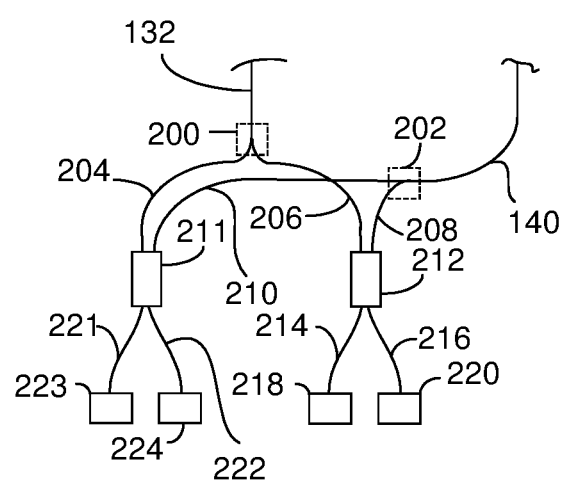
FIG. 4A through FIG. 4B illustrate an example of a suitable processing components for use in the LIDAR system of FIG. 3.
Figure 4B:
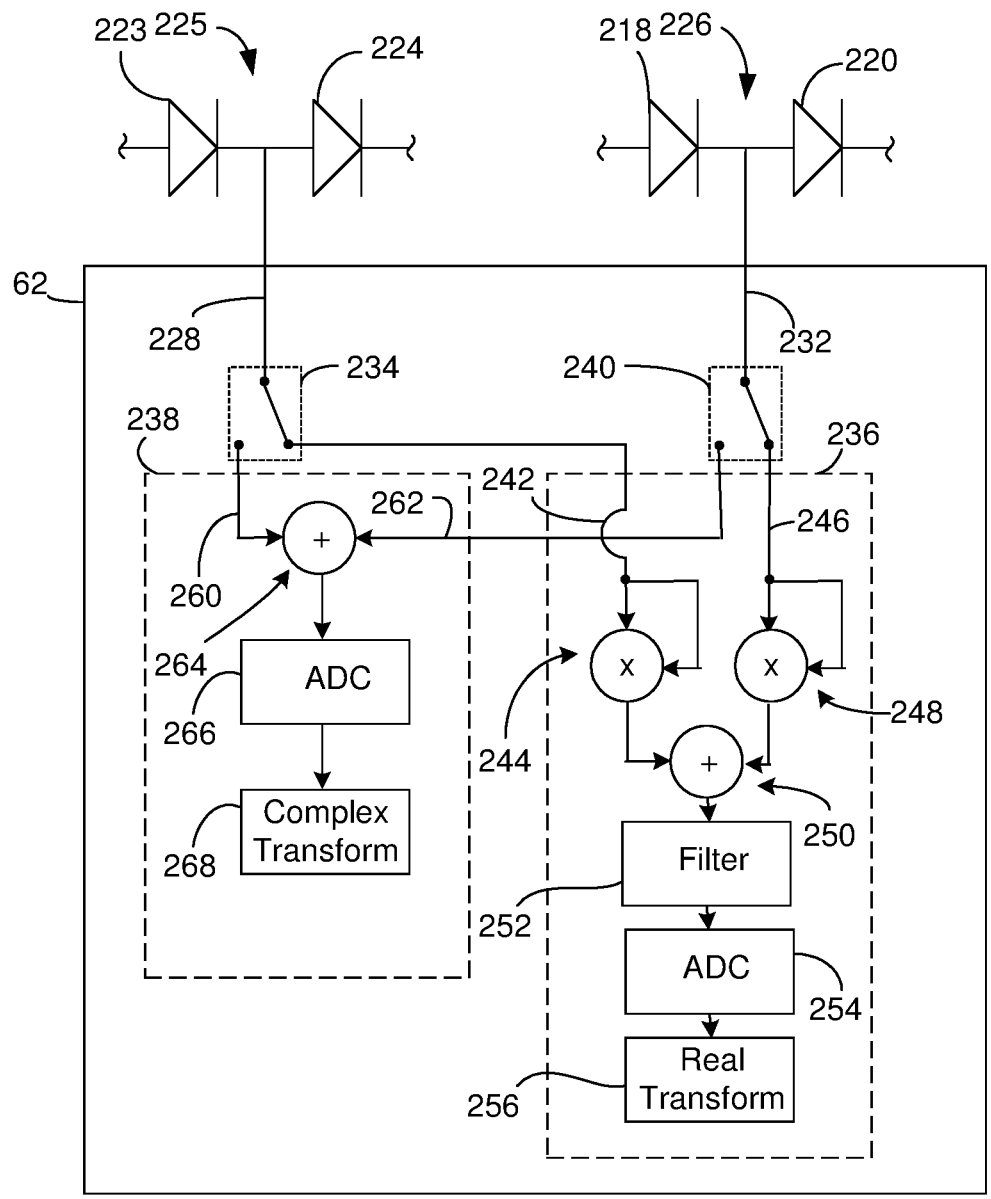

FIG. 4A through FIG. 4B illustrate an example of a suitable processing components for use in the LIDAR system of FIG. 3. A first splitter 202 divides a reference signal carried on a reference waveguide 140 onto a first reference waveguide 210 and a second reference waveguide 208. The first reference waveguide 210 carries a first portion of the reference signal to a light-combining component 211. The second reference waveguide 208 carries a second portion of the reference signal to a second light-combining component 212.

A second splitter 200 divides the comparative signal carried on the comparative waveguide 132 onto a first comparative waveguide 204 and a second comparative waveguide 206. The first comparative waveguide 204 carries a first portion of the comparative signal to the light-combining component 211. The second comparative waveguide 208 carries a second portion of the comparative signal to the second light-combining component 212.

The second light-combining component 212 combines the second portion of the comparative signal and the second portion of the reference signal into a second composite signal. Due to the difference in frequencies between the second portion of the comparative signal and the second portion of the reference signal, the second composite signal is beating between the second portion of the comparative signal and the second portion of the reference signal. The light-combining component 212 also splits the resulting second composite signal onto a first auxiliary detector waveguide 214 and a second auxiliary detector waveguide 216.

The first auxiliary detector waveguide 214 carries a first portion of the second composite signal to a first auxiliary light sensor 218 that converts the first portion of the second composite signal to a first auxiliary electrical signal. The second auxiliary detector waveguide 216 carries a second portion of the second composite signal to a second auxiliary light sensor 220 that converts the second portion of the second composite signal to a second auxiliary electrical signal. Examples of suitable light sensors include germanium photodiodes (PDs), and avalanche photodiodes (APDs).

The first light-combining component 211 combines the first portion of the comparative signal and the first portion of the reference signal into a first composite signal. Due to the difference in frequencies between the first portion of the comparative signal and the first portion of the reference signal, the first composite signal is beating between the first portion of the comparative signal and the first portion of the reference signal. The light-combining component 211 also splits the first composite signal onto a first detector waveguide 221 and a second detector waveguide 222.

The first detector waveguide 221 carries a first portion of the first composite signal to a first light sensor 223 that converts the first portion of the second composite signal to a first electrical signal. The second detector waveguide 222 carries a second portion of the second composite signal to a second auxiliary light sensor 224 that converts the second portion of the second composite signal to a second electrical signal. Examples of suitable light sensors include germanium photodiodes (PDs), and avalanche photodiodes (APDs).

The first reference waveguide 210 and the second reference waveguide 208 are constructed to provide a phase shift between the first portion of the reference signal and the second portion of the reference signal. For instance, the first reference waveguide 210 and the second reference waveguide 208 can be constructed so as to provide a 90 degree phase shift between the first portion of the reference signal and the second portion of the reference signal. As an example, one reference signal portion can be an in-phase component and the other a quadrature component. Accordingly, one of the reference signal portions can be a sinusoidal function and the other reference signal portion can be a cosine function. In one example, the first reference waveguide 210 and the second reference waveguide 208 are constructed such that the first reference signal portion is a cosine function and the second reference signal portion is a sine function. Accordingly, the portion of the reference signal in the second composite signal is phase shifted relative to the portion of the reference signal in the first composite signal, however, the portion of the comparative signal in the first composite signal is not phase shifted relative to the portion of the comparative signal in the second composite signal.

The first light sensor 223 and the second light sensor 224 can be connected as a balanced detector and the first auxiliary light sensor 218 and the second auxiliary light sensor 220 can also be connected as a balanced detector. For instance, FIG. 4B provides a schematic of the relationship between the electronics, the first light sensor 223, the second light sensor 224, the first auxiliary light sensor 218, and the second auxiliary light sensor 220. The symbol for a photodiode is used to represent the first light sensor 223, the second light sensor 224, the first auxiliary light sensor 218, and the second auxiliary light sensor 220 but one or more of these sensors can have other constructions. In some instances, all of the components illustrated in the schematic of FIG. 4B are included on the LIDAR system. In some instances, the components illustrated in the schematic of FIG. 4B are distributed between the LIDAR system and electronics located off of the LIDAR system.

The electronics connect the first light sensor 223 and the second light sensor 224 as a first balanced detector 225 and the first auxiliary light sensor 218 and the second auxiliary light sensor 220 as a second balanced detector 226. In particular, the first light sensor 223 and the second light sensor 224 are connected in series. Additionally, the first auxiliary light sensor 218 and the second auxiliary light sensor 220 are connected in series. The serial connection in the first balanced detector is in communication with a first data line 228 that carries the output from the first balanced detector as a first data signal. The serial connection in the second balanced detector is in communication with a second data line 232 that carries the output from the first balanced detector as a second data signal. The first data signal and the second data signal are beating as a result of the beating between the comparative signal and the reference signal, i.e. the beating in the first composite signal and in the second composite signal.

The first data line 228 carries the first data signal to a first switch 234. The first switch can be in a first configuration where the first data signal is carried to a distance branch 236 or in a second configuration where the first data signal is carried to a velocity branch 238. In FIG. 4B, the first switch 234 is shown in the first configuration. The second data line 232 carries the second data signal to a second switch 240. The second switch can be in a first configuration where the second data signal is carried to the distance branch 236 or in a second configuration where the second data signal is carried to a velocity branch 238. In FIG. 4B, the second switch 240 is shown in the first configuration. A suitable switch for use as the first switch and/or second switch includes, but is not limited to, an electromechanical switch, and a solid state MOSFET or PIN diode switch.

The electronics operate the first switch and the second switch such that they are in the same configuration during the first period and during the second period. For instance, the electronics can operate the first switch and the second switch such that the first switch and the second switch are both in the first configuration during the first period and both in the second configuration during the second period. In this example, the first data signal and the second data signal are carried to the distance branch 236 during the first period and to the velocity branch 238 during the second period.

During operation of the LIDAR system, the generation of LIDAR data is divided into a series of cycles where LIDAR data is generated for each cycle. In some instances, each of the cycles corresponds to a different sample region in the field of view. Accordingly, different cycles can generate LIDAR data for different regions in a field of view.

The cycles can be performed such that the time for each cycle can be divided into different time periods such as a first period and a second period. In some instances, the distance between the reflecting object and the LIDAR chip can be determined in the first period and the radial velocity between the reflecting object and the LIDAR chip is determined in the second period.

The electronics are configured to use the first data signal and the second data signal to determine or approximate at least the distance between the LIDAR system and the reflecting object. For instance, during the first period, the electronics can operate the modulator 114 so as to add chirp to the amplitude of the outgoing LIDAR signal and accordingly the LIDAR output signal. Adding chirp to the amplitude can include modulating the amplitude of the outgoing LIDAR signal such that the amplitude of the outgoing LIDAR signal is a function of a sinusoid. In one example, the amplitude of the outgoing LIDAR signal is modulated such that the amplitude of the outgoing LIDAR signal is a square root of a function that includes a sinusoid and/or is a square root of a sinusoid. For instance, the outgoing LIDAR signal can be modulated so as to produce a modulated outgoing LIDAR signal and LIDAR output signal mathematically represented by Equation 1: $(M+N*\cos(C*t+D*t^2))^{1/2}\cos(F*t)$ where M, N, C, D and F are constants, t represents time, $M>0$, $N>0$, and $M \geq N$ in order to prevent the radicand from becoming negative, $C>0$, $D \neq 0$. As will become evident below, F can be a function of the frequency of the LIDAR output signal ($f_c$). In Equation 1, F and C can be selected such that $F>>C$.

The distance branch includes a first distance branch line 242. During the first period, the first distance branch line 242 carries the first data signal to a first multiplier 244. In FIG. 4B, the first multiplier 244 is configured to square the amplitude of the first data signal and to output a first multiplied data signal. The distance branch includes a second distance branch line 246. During the first period, the second distance branch line 246 carries the second data signal to a second multiplier 248. In FIG. 4B, the second multiplier 248 is configured to square the amplitude of the second data signal and to output a second multiplied data signal. Suitable first multipliers and/or second multipliers include, but are not limited to, RF mixers such as a Gilbert cell mixer.

The distance branch includes an adder 250 that sums the first multiplied data signal and the second multiplied data signal. The adder outputs a summed data signal. Suitable adders include, but are not limited to, RF combiners including resistive or hybrid combiners. The distance branch includes a low-pass filter 252 that receives the summed data signal and outputs a beating data signal. The low-pass filter is selected to remove higher frequency contributions to the summed data signal that are artifacts of the mixing of the reference and return signals. The low-pass filter can be selected to have a bandwidth greater than or equal to: $f_{dmax}/2+\alpha\tau_{0max}$ where $f_{dmax}$ represents the maximum level of the Doppler shift of the LIDAR input signal relative to the LIDAR input signal for which the LIDAR system is to provide reliable results, $\tau_{0max}$ represents maximum delay between transmission of the LIDAR output signal and the receipt of the LIDAR input signal, and α represents the rate of change in the frequency of the chirp added to the amplitude of the modulated outgoing LIDAR signal during the duration of the sample period (i.e. the first period). In some instances, α is determined from B/T where B represents the change in the frequency of the chirp added to the amplitude of the modulated outgoing LIDAR signal during the duration of the sample period and T is the duration of the sample period. In some instances, T is determined from: $T=[\lambda_c/(2\Delta v_{min})]+\tau_{0max}$ where $\lambda_c$ represents the wavelength of the outgoing LIDAR signal, $\Delta v_{min}$: represents velocity resolution and B can be determined from $B=cT/(2(T-\tau_{0max})\Delta R_{min})$ where c represents the speed of light and $\Delta R_{min}$ represents distance resolution. In some instances, the filter has a bandwidth greater than 0.1 GHz, 0.2 GHz, or 0.3 GHz and/or less than 0.4 GHz, 0.5 GHz, or 1 GHz. Corresponding values for the sweep period (T) can be 110 μs, 8 μs, 4 μs, 3 μs, 2 μs, and 1 μs.

The distance branch includes an Analog-to-Digital Converter (ADC) 254 that receives the beating data signal from the filter. The Analog-to-Digital Converter (ADC) 254 converts the beating data signal from an analog form to digital form and outputs the result as a digital LIDAR data signal. As discussed above, the conversion of the beating data signal includes sampling the beating data signal at a sampling rate. The addition of the chirp to the amplitude of the LIDAR output signal substantially reduces or removes the effects of radial velocity from the beating of the composite signal and the resulting electrical signals. For instance, the frequency shift of the LIDAR output signal relative to the LIDAR input signal ("frequency shift," Δf) can be written as $\Delta f=\Delta f_d+\Delta f_s$ where $\Delta f_d$ represents the change in frequency due to the Doppler shift and $\Delta f_s$ is the change in frequency due to the separation between the reflecting object and the LIDAR system. The outgoing LIDAR signal can be modulated so as to produce a modulated outgoing LIDAR signal and accordingly, a LIDAR output signal that is also modulated, where the change in frequency due to the Doppler shift ($\Delta f_d$) is less than 10%, 5%, 1%, or even 0.1% of the Doppler shift that would occur from a sinusoidal LIDAR output signal serving as the LIDAR and having a constant amplitude and the same frequency as the modulated outgoing LIDAR signal and/or the LIDAR output signal. For instance, the outgoing LIDAR signal and/or the LIDAR output signal can be modulated so as to produce a modulated outgoing LIDAR signal and/or a LIDAR output signal where the change in frequency due to the Doppler shift ($\Delta f_d$) is less than 10%, 5%, 1%, or even 0.1% of the Doppler shift that would occur from a continuous wave serving as the LIDAR output signal and having the same frequency as the modulated outgoing LIDAR signal and/or the LIDAR output signal. In another example, the outgoing LIDAR signal and/or the LIDAR output signal are modulated so as to produce a modulated outgoing LIDAR signal and/or a LIDAR output signal where the change in frequency due to the Doppler shift ($\Delta f_d$) is less than 10%, 5%, 1%, or even 0.1% of the Doppler shift that would occur from the outgoing LIDAR signal before modulation (the unmodulated outgoing LIDAR signal) serving as the LIDAR output signal. These results can be achieved by increasing the value of the Equation 1 variable F relative to C. For instance, F can represent $2\pi f_c$ and C can represent $2\pi f_1$ where $f_1$ denotes the base frequency of the frequency-chirp in the amplitude of the modulated outgoing LIDAR signal. Accordingly, F can be increased relative to C by increasing the value of the frequency of the LIDAR output signal ($f_c$) relative to the chirp base frequency ($f_1$). As an example, $f_c$ and $f_1$ can be selected such that $f_c \gg f_1$. In some instances, $f_c$ and $f_1$ are selected such that a ratio of $f_c:f_1$ is greater than 2:1, 10:1, $1\times10^4:1$, $5\times10^4$, or $1\times10^5:1$ and/or less than $5\times10^5$, $1\times10^6$, $5\times10^6$ or $5\times10^8$. Accordingly, the variables F and C can also have these same values for a ratio of F:C. The reduction and/or removal of the change in frequency due to the Doppler shift ($\Delta f_d$) from the frequency shift lowers the beat frequency and accordingly reduces the required sampling rate.

The distance branch includes a transform module 256 that receives the digital LIDAR data signal from the Analog-to-Digital Converter (ADC) 254. The transform module 256 is configured to perform a real transform on the digital LIDAR data signal so as to convert from the time domain to the frequency domain. This conversion provides an unambiguous solution for the shift in frequency of the shift of the LIDAR input signal relative to the LIDAR input signal that is caused by the distance between the reflecting object and the LIDAR system. A suitable real transform is a Fourier transform such as a Fast Fourier Transform (FFT). The classification of the transform as a real transform distinguishes the transform from complex transforms such as complex Fourier transforms. The transform module can execute the attributed functions using firmware, hardware or software or a combination thereof.

Since the frequency provided by the transform module does not have input from, or does not have substantial input from, a frequency shift due to relative movement, the determined frequency shift can be used to approximate the distance between the reflecting object and the LIDAR system. For instance, the electronics can approximate the distance between the reflecting object and the LIDAR system ($R_0$) using Equation 3: $R_0=c*\Delta f/(2\alpha)$ where Δf can be approximated as the peak frequency output from the transform module, and c is the speed of light.

The velocity branch can be configured to use the first data signal and the second data signal to determine or approximate at least the radial velocity of the LIDAR system and the reflecting object. The LIDAR output signal with a frequency that is a function of time disclosed in the context of FIG. 1A through FIG. 2 can be replaced by a LIDAR output signal where the frequency of the LIDAR output signal is not a function of time. For instance, the LIDAR output signal can be a continuous wave (CW). For instance, during the second period, the modulated outgoing LIDAR signal, and accordingly the LIDAR output signal, can be an unchirped continuous wave (CW). As an example the modulated outgoing LIDAR signal, and accordingly the LIDAR output signal, can be represented by Equation 2: G*cos(H*t) where G and H are constants and t represents time. In some instances, G represents the square root of the power of the outgoing LIDAR signal and/or H represents the constant F from Equation 1. In instances where the output of the light source has the waveform that is desired for the modulated outgoing LIDAR signal, the electronics need not operate the modulator 114 so as to modify the outgoing LIDAR signal. In these instances, the output of the light source(s) can serve as the modulated outgoing LIDAR signal and accordingly the LIDAR output signal. In some instances, the electronics operate the modulator 114 so as to generate a modulated outgoing LIDAR signal with the desired form.

Since the frequency of the LIDAR output signal is constant in the second period, changing the distance between reflecting object and LIDAR system does not cause a change to the frequency of the LIDAR input signal. As a result, the separation distance does not contribute to the shift in the frequency of the LIDAR input signal relative to the frequency of the LIDAR output signal. Accordingly, the effect of the separation distance has been removed or substantially from the shift in the frequency of the LIDAR input signal relative to the frequency of the LIDAR output signal.

The velocity branch includes a first velocity branch line 260 and a second velocity branch line 260. During the second period, the first velocity branch line 260 carries the first data signal to an Analog-to-Digital Converter (ADC) 264 which converts the first data signal from an analog form to a digital form and outputs a first digital data signal. As discussed above, the conversion of the first data signal is done by sampling the first data signal at a sampling rate. The use of a continuous wave as the LIDAR output signal substantially removes the effects of distance between the reflecting object and LIDAR system from the beating of the composite signal and the resulting electrical signals. Accordingly, the beating frequency is reduced and the required sampling rate is reduced.

The second velocity branch line 262 carries the second data signal to an Analog-to-Digital Converter (ADC) 266 which converts the second data signal from an analog form to a digital form and outputs a second digital data signal. As discussed above, the conversion of the second data signal includes sampling the second data signal at a sampling rate. The use of a continuous wave as the LIDAR output signal substantially reduces or removes the effects of distance between the reflecting object and LIDAR system from the beating of the second composite signal and the resulting electrical signals. Accordingly, the beating frequency is reduced and the required sampling rate is reduced.

The sampling rate for the Analog-to-Digital Converter (ADC) 264 can be the same or different from the sampling rate for the Analog-to-Digital Converter (ADC) 266.

The velocity branch includes a transform module 268 that receives the first digital data signal from the Analog-to-Digital Converters (ADC) 264 and the second digital data signal from the Analog-to-Digital Converters (ADC) 266. Since the first data signal is an in-phase component and the second data signal its quadrature component, the first data signal and the second data signal together act as a complex velocity data signal where the first data signal is the real component and the second data signal is the imaginary component. As a result, the first digital data signal can be the real component of a digital velocity data signal and the second data signal can be the imaginary component of the digital velocity data signal. The transform module 168 can be configured to perform a complex transform on the digital velocity data signal so as to convert from the time domain to the frequency domain. This conversion provides an unambiguous solution for the shift in frequency of LIDAR input signal relative to the LIDAR input signal that is caused by the radial velocity between the reflecting object and the LIDAR system. A suitable complex transform is a Fourier transform such as a complex Fast Fourier Transform (FFT). The transform module can execute the attributed functions using firmware, hardware or software or a combination thereof.

Since the frequency shift provided by the transform module 268 does not have input from a frequency shift due to the separation distance between the reflecting object and the LIDAR system, and because of the complex nature of the velocity data signal, the output of the transform module 268 can be used to approximate the radial velocity between the reflecting object and the LIDAR system. For instance, the electronics can approximate the radial velocity between the reflecting object and the LIDAR system (v) using Equation 4: $v = c*f_d/(2*f_c)$ where $f_d$ is approximated as the peak frequency output from the transform module 268, c is the speed of light, and $f_c$ represents the frequency of the LIDAR output signal.

Additional components can be added to the schematic of FIG. 4B. For instance, when the LIDAR system generates multiple LIDAR output signals or is used with other LIDAR systems that generate LIDAR output signals (i.e., by means of frequency or wavelength division multiplexing, FDM/WMD), the LIDAR system can include one or more filters to remove interfering signals from the real and/or imaginary components of the beating data signal and/or of the velocity data signal. Accordingly, the LIDAR system can include one or more filters in addition to the illustrated components. Suitable filters include, but are not limited to, lowpass filters. In the case of the optical design, if the frequency of the interfering components fall outside the bandwidth of the balance detector(s), additional filtering may not be necessary as it may be effectively provided by the balance detector(s).

The sampling rate that is used during the first period and the second period can be selected to have a value that is greater than or equal to the larger of two values selected from the group consisting of the minimum sampling rate for the first period and the minimum sampling rate for the second period. For instance, during the first period the range of rates for the first period sampling rate ($f_{s1}$) can be determined by $f_{s1} \geq 2 \times \alpha \tau_{0max}$ where $\tau_{0max}$ represents the maximum amount of time between the transmission of the LIDAR output signal and the receipt of the LIDAR input signal. During the second period the range of rates for the second period sampling rate ($f_{s2}$) can be determined by $f_{s2} \geq 2 \times f_{dmax}$ where $f_{dmax}$ represents the maximum level of the Doppler shift of the LIDAR input signal relative to the LIDAR input signal for which the LIDAR system is to provide reliable results. The maximum is determined by the largest level for which the LIDAR system is to provide reliable results. Accordingly, the maximum distance generally corresponds to the distance for the field of view set in the LIDAR specifications and the maximum Doppler shift generally corresponds to the Doppler shift that would occur at the maximum radial velocity values set in the specifications. These two equations show that the minimum sampling rate for the first period is $2\alpha\tau_{0max}$ and the minimum sampling rate for the second period is $2f_{dmax}$. As a result, the sampling rate is selected to have a value that is greater than or equal to the larger of $2\alpha\tau_{0max}$ and $2f_{dmax}$. In other words, the sample rate used during the first period and the second period ($f_s$) is $f_s \geq \max(2\alpha\tau_{0max}, 2f_{dmax})$. In some instances, the sample rate used during the first period and the second period ($f_s$) is greater than or equal to 0.1 GHz, 0.2 GHz, or 0.5 GHz and/or less than 1 GHz, 2 GHz, or 4 GHZ.

The above description of the LIDAR system operation assumes that a modulator is present on the utility waveguide 112; however, the modulator is optional. In these instances, the electronics can operate the light source(s) 110 so as to increase the frequency of the outgoing LIDAR signal during the first period and during the second period the electronics can decrease the frequency of the outgoing LIDAR signal. Suitable methods for extracting the LIDAR data from the resulting composite signals are disclosed in U.S. Patent Application Ser. No. 62/671,913, filed on May 15, 218, entitled "Optical Sensor Chip," and incorporated herein in its entirety.

Although the LIDAR system of FIG. 3 through FIG. 4B is disclosed as generating a transmitted signal that includes multiple channels, the LIDAR system of FIG. 3 through FIG. 4B can be configured to generate a transmitted signal that include a single channel. According, the light source can be configured to output a single channel.

Although the light sources of FIG. 1 through FIG. 4B are illustrated as single component, the light source can be constructed from multiple components. For instance, a light source can include multiple different lasers that generate laser outputs that are multiplexed together so as to generate a LIDAR output signal.

Figure 5:
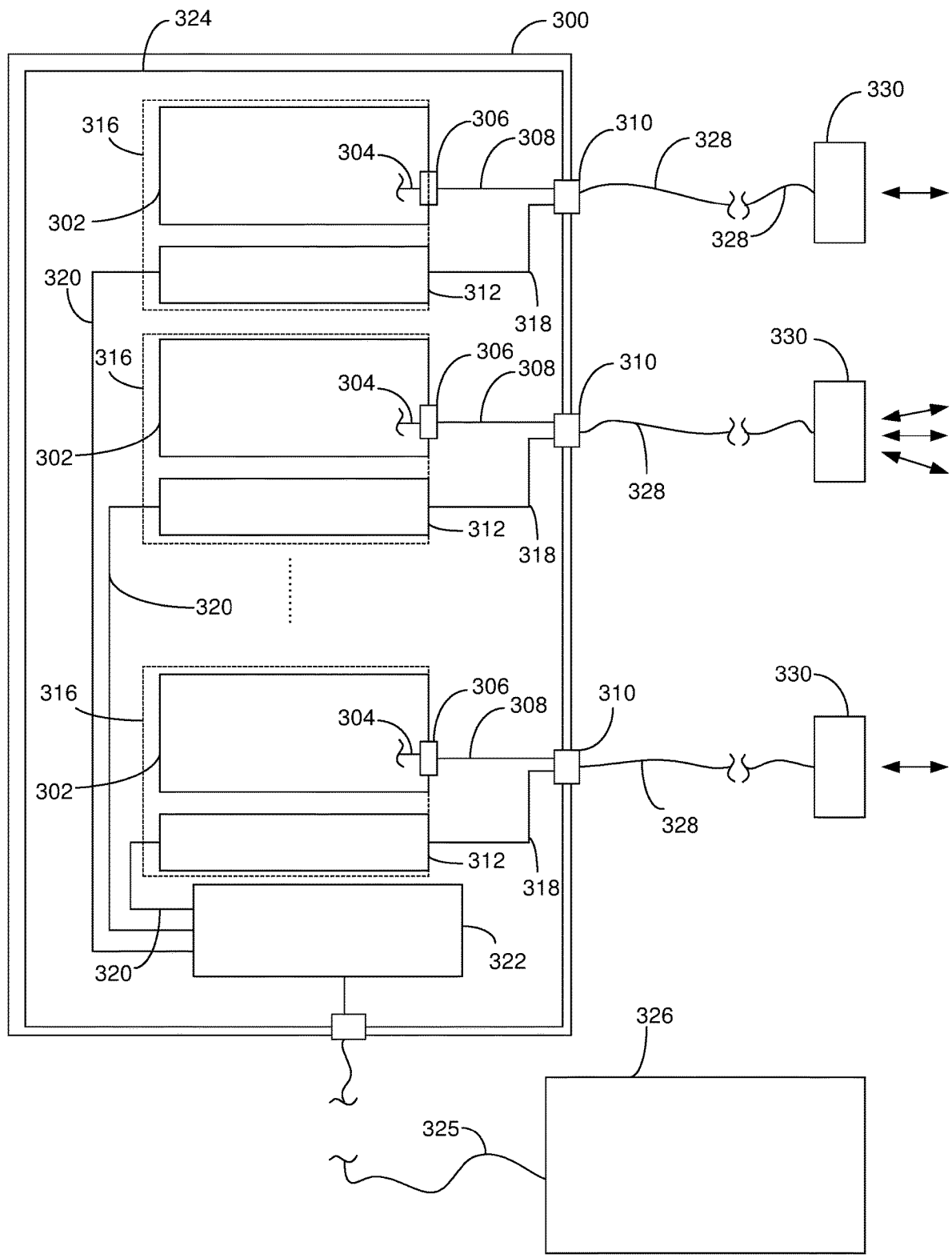
FIG. 5 is a schematic of an optical manifold system that is suitable for use with the above LIDAR systems.

FIG. 5 illustrates schematic of an optical manifold system that is suitable for use with the above LIDAR systems. The optical manifold system includes a housing 300 that contains one or more cores 302. Each core can be constructed according to the LIDAR system of FIG. 1 through FIG. 2 or according to FIG. 3 through FIG. 4B or can include a different construction. Accordingly, each core includes a LIDAR waveguide 304 that can be the utility waveguide 16 of FIG. 1 or the LIDAR signal waveguide 124 of FIG. 3. As a result, the LIDAR waveguide 304 can output the outgoing LIDAR signal and receive the incoming LIDAR signal. Additionally, the outgoing LIDAR signal and the incoming LIDAR signal can each include one or more channels.

The cores each include an interface 306 between a LIDAR waveguide 304 and an optical interconnect 308 such as an optical fiber. The optical interconnect can carry the outgoing LIDAR signal to a connector 310 and can carry the incoming LIDAR signal from the connector 310 to the interface 306. The optical interconnect is optional and the interface can be an interface between the LIDAR waveguide 304 and the connector 310. Suitable interfaces include, but are not limited to, lens coupling to polished or etched waveguide facets, fiber block assemblies coupled to polished or etched facet waveguide facets, and mirror or grating couplers coupled with lens or fiber block assemblies. Suitable connectors include, but are not limited to, ferrule connectors such as FC, LC, MPO/MPT.

The cores are each associated with core electronics 312 that operate each core and that generate the LIDAR data from the associated core as disclosed in the context of FIG. 1 through FIG. 4. Accordingly, the core electronics can be the electronics disclosed in the context of FIG. 1 through FIG. 2 or the electronics disclosed in the context of FIG. 3 through FIG. 4. Each core and the associated core electronics can optionally be included on a single core card 316. Suitable core cards include, but are limited to, printed circuit boards (PCBs).

An electrical link 318 provides electrical communication between each core and the connector 310. Suitable electrical links 318 include, but are not limited to, coaxial cable, and twisted pair cable.

Data electrical links 320 each provide electrical communication between one of the cores and master electronics 322. In some instances, the master electronics are included on a master board 324 such as a Printed Circuit Board (PCB). When the master electronics are included on a master board 324, the cores and the core electronics 312 can be mounted on the master board 324. For instance, when the cores and the associated core electronics are on a core card 316, the core cards 316 can each be mounted on the master board 324.

A controller electrical link 325 provides electrical communication between the master electronics 322 and remote electronics 326. In addition to processing signals from the master electronics 322, the remote electronics 326 generally processes the signals from a variety of different sensors. For instance, when the optical manifold is included in a vehicle, the remote electronics 326 can process signals from cameras, inertial sensors, rotational sensors, radar, infra-red (IR) cameras, radio navigation systems such as the Global Positioning System (GPS), and acoustic sensors such as microphones.

Communications links 328 each provides electrical communication between one of the connectors 310 and a scanning head 330. The communications links are each configured to carry the outgoing LIDAR signal from the connector 310 to a scanning head 330 and to carry the incoming LIDAR signals from the scanning head 330 to a connector 310. Additionally, the communications links are each configured to provide electrical communication between one of the connectors and the associated scanning head. Accordingly, the communications links enable electrical communication between the core electronics and the associated scanning head. When the communications links 328 carry both optical signals and electrical signals, the communications links can include waveguides such as optical fibers and electrical conductors such as wires and cables.

During operation of the optical manifold, the core electronics each operates the associated core as disclosed in the context of FIG. 1 through FIG. 4B. Accordingly, the core electronics each generates LIDAR data for different sample regions in a field of view. The core electronics can provide the generated LIDAR data to the master electronics over the data electrical links 320. The master electronics can provide the generated LIDAR data to the remote electronics over the communications link 329. Accordingly, the remote electronics can receive one or more electrical signals from the optical manifold that include a data stream that includes a series of data fields. The data fields can be arranged so to identify a sample region in a field of view and the LIDAR data associated with the identified sample region for a series of different sample regions. In some instances, the remote electronics combine the received LIDAR data with data from other sources such as cameras, inertial sensors, rotational sensors, radar, infra-red (IR) cameras, radio navigation systems such as the Global Positioning System (GPS), and acoustic sensors such as microphones. The remote electronics can combine the LIDAR data with the other data to control a device.

Although the connectors are illustrated as a single connector, each connector can include more than one connector. For instance, one of the illustrated connectors can include one or more optical connectors that provide an interface between optical components such as between waveguides such as optical fibers and one or more electrical connectors that provide an interface between electrical components such as between electrical conductors such as a wires, cables, conductive lines, and metal traces.

The use of the connectors allows the cores to be easily interchanged so the manifold can be reconfigured. For instance, the interior of the housing 300 can be accessible by an operator. As an example, the housing can include one or more covers and/or one or more lids that allow an operator to access the interior of the housing. An example of a suitable cover includes, but is not limited to, a PC expansion slot cover. As a result, an operator can replace a first core card 316 located in the manifold with a second core card 316 by disconnecting the first core card 316 from the associated connector and subsequently connecting the second core card 316 to the connector. The first core card 316 can have different optical properties from the second core card 316. For instance, the first core card 316 can generate a different outgoing LIDAR signal than the second core card. As an example, the outgoing LIDAR signal generated by the first core card 316 and the outgoing LIDAR signal generated by the second core card 316 can have one more different properties selected from a group consisting of a different number of channels, different channel wavelengths, different channel waveforms, different channel modulation/chirp configurations, and different coherent receiver configurations. Other optical properties that can be different between the first core card 316 and the second core card include, but are not limited to, presence or absence of means of amplification, presence or absence of additional optical components such as multiplexers, demultiplexers and splitters. In addition, or as an alternative to, the first core card 316 having different optical properties from the second core card 316, the core electronics on the first core card can be different from the core electronics on the second core card. As an example, the core electronics on the first core card can generate the LIDAR data as disclosed in the context of FIG. 1 and FIG. 2 and the second core card can generate the LIDAR data as disclosed in the context of FIG. 3 and FIG. 4. Other electrical properties that can be different between the first core card 316 and the second core card include, but are not limited to, sampling speed capability, digital bit resolution, and signal processing capability. The ability to interchange the core cards allows properties of the manifold to be changed by changing the cores within the housing.

Although the manifold of FIG. 5 illustrates each core and/or each core card generating a single LIDAR output signal, one or more of the cores can be configured to generate multiple LIDAR output signals. The LIDAR output signals from the same core can be received at different scanning heads. As a result, a single core and/or core card can be associated with more than one scanning head.

Figure 6:
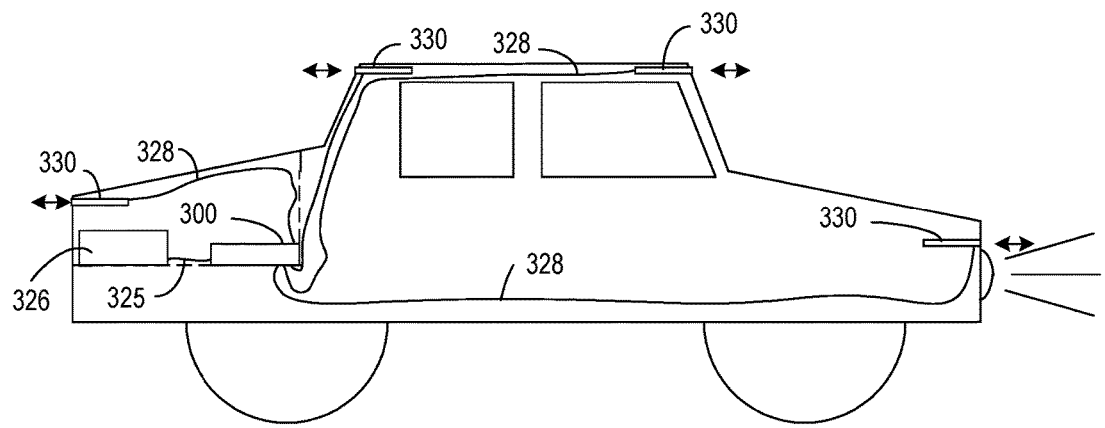
FIG. 6 illustrates an application of an optical manifold system.

FIG. 6 illustrates one application of the illustrated optical manifold system. The optical manifold system is included in a transportation vehicle such as a car. The scanning heads 330 are located at a variety of different locations around the vehicle. The housing is located in a secure location such as a trunk. The master electronics in the housing are in electrical communication with the remote electronics that are also located in the trunk. In this configuration, LIDAR data can be generated for multiple different fields of view arranged around the vehicle and the remote electronics can combine the LIDAR data with data generated from other sensors and devices.

Figure 7A:
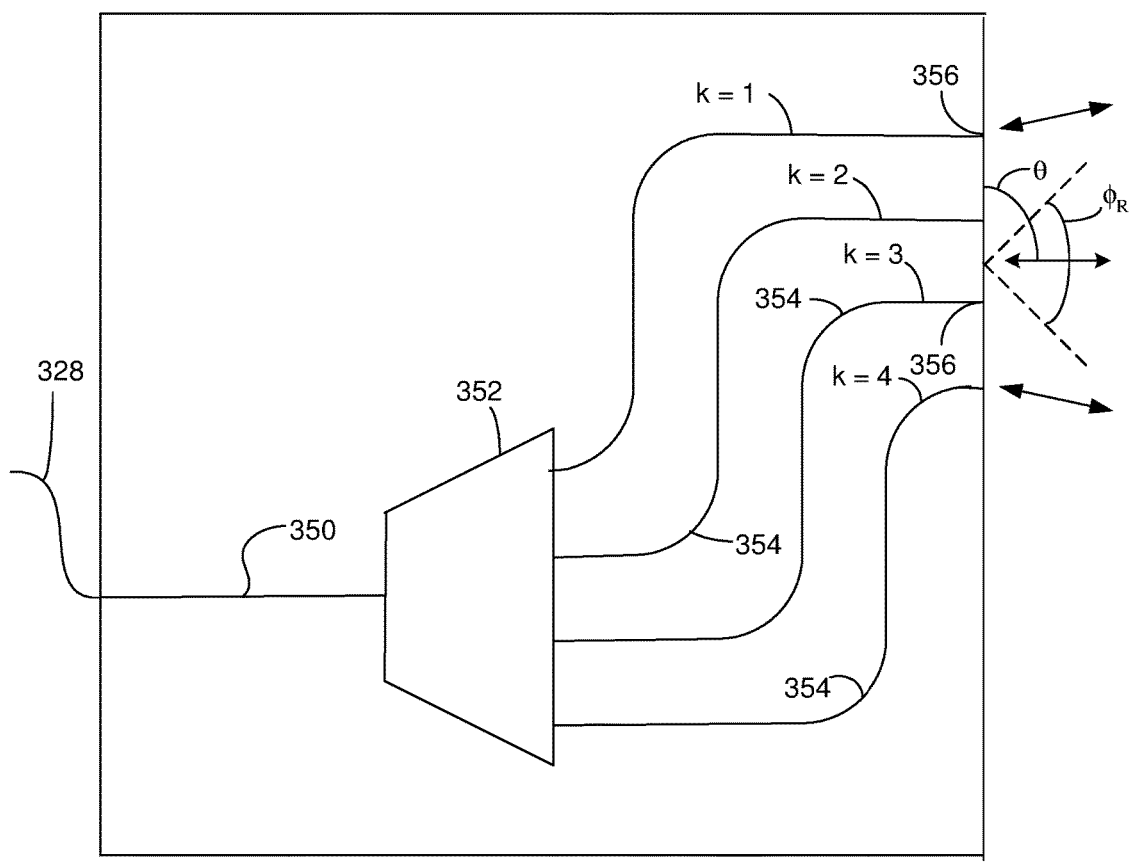
FIG. 7A and FIG. 7B illustrate a suitable construction of a scanning head or of a portion of a scanning head.
Figure 7B:
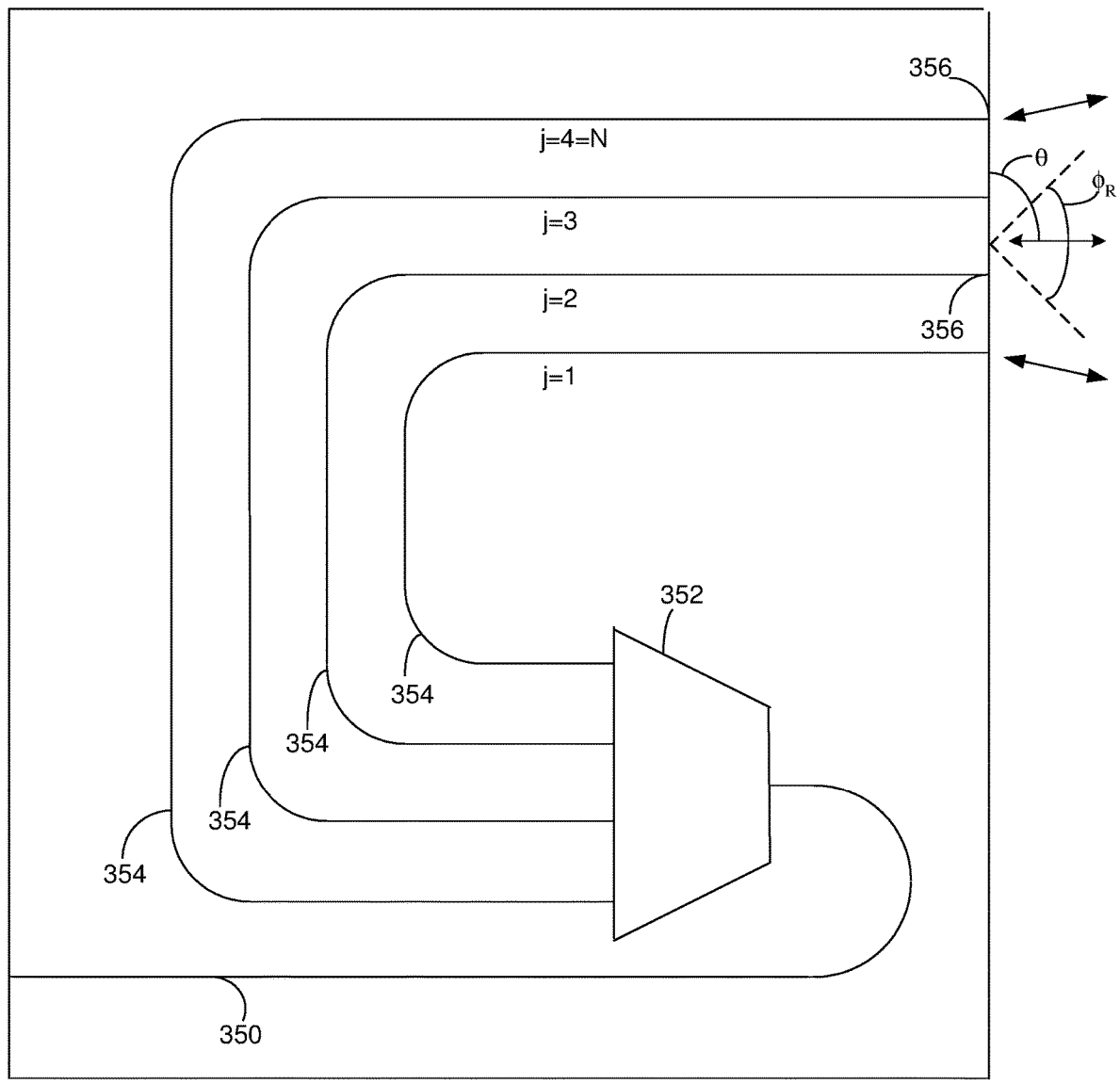

FIG. 7A and FIG. 7B illustrate a suitable construction of a scanning head or of a portion of a scanning head. The scanning head includes a head waveguide 350 that receives the outgoing LIDAR signal over a communications link 328. The head waveguide 350 carries the outgoing LIDAR signal to a splitter 352 that divides the outgoing LIDAR signal into multiple output signals that are each carried on a different steering waveguide 354. Each of the steering waveguides ends at a facet 356. The facets are arranged such that the output signals exiting the chip through the facets combine to form an output signal.

During operation of the scanning head, at least a portion of the output signal is reflected by an object located off the chip. At least a portion of the reflected signal returns to the facets 356 of the steering waveguides 354 and enters the steering waveguides 354 as a portion of a LIDAR input signal. The steering waveguides 354 carry the portions of the LIDAR input signal to the splitter 354 where they are combined into the incoming LIDAR signal carried on the head waveguide 350.

The splitter 352 and steering waveguides 354 can be constructed such that there is a phase differential between output signals at the facet 356 of adjacent steering waveguides 354. For instance, the splitter 352 and steering waveguides 354 can be constructed such that there is a linearly increasing phase differential between output signals at the facet 356 of adjacent steering waveguides 354. For instance, the steering waveguides 354 can be constructed such that the phase of steering waveguide number j is $f_o+(j-1)f$ where j is an integer from 1 to N and represents the number associated with a steering waveguide when the steering waveguides are sequentially numbered as shown in FIG. 7A and FIG. 7B, f is the phase differential between neighboring steering waveguides, and $f_o$ is the phase of the output signal at the facet 356 of steering waveguide j=1. In some instances, the phase differential is achieved by constructing the steering waveguides such that the steering waveguides have a linearly increasing length differential. For instance, the length of steering waveguide j can be represented by $L_o+(j-1)\Delta L$ where j is an integer from 1 to N and represents the number associated with a steering waveguide when the steering waveguides are sequentially numbered as shown in FIG. 7A and FIG. 7B, $\Delta L$ is the length differential between neighboring steering waveguides, and $L_o$ is the length of steering waveguide j=1. Suitable $\Delta L$ include, but are not limited to, $\Delta L$ greater than 0, or 5 and/or less than 25, or 50 µm. Suitable f include, but are not limited to, f greater than $0\pi$, or $7\pi$ and/or less than $15\pi$, or $20\pi$. Suitable N include, but are not limited to, N greater than 10, or 500 and/or less than 1000, or 2000. Suitable splitters include, but are not limited to, star couplers, cascaded Y-junctions and cascaded 1X2 MMI couplers. The steering waveguides 354 configuration of FIG. 7B may be preferred as the length differential between neighboring steering waveguides ($\Delta L$) increases.

When the outgoing LIDAR signal includes multiple different channels, the length differential between neighboring steering waveguides ($\Delta L$) is a different percent of the wavelength of different channels. As a result, the output signal separates into multiple different LIDAR output signals that each travels away from the scanning head in a different direction ($\theta$). Each of the different LIDAR output signals is associated with a different channel. Accordingly, the scanning head outputs one or more LIDAR output signals that are each associated with a different channel.

When the steering waveguides are the same length, the value of $\Delta L$ is zero and the value off is zero. Suitable $\Delta L$ include, but are not limited to, $\Delta L$ greater than 0, or 5 and/or less than 10, or 15 µm. Suitable f include, but are not limited to, f greater than $0\pi$, or $7\pi$ and/or less than $15\pi$, or $20\pi$. Suitable N include, but are not limited to, N greater than 10, or 500 and/or less than 1000, or 2000. Suitable splitters 352 include, but are not limited to, star couplers, cascaded Y-junctions and cascaded 1×2 MMI couplers.

Electronics in the optical manifold system can alter one or more characteristics of the outgoing LIDAR signal so as to change the direction that the one or more LIDAR output signals travel away from the scanning head. For instance, the core electronics can tune the wavelength and/or frequency of the one or more channels in the outgoing LIDAR signal so as to change the direction that the one or more LIDAR output signals travel away from the scanning head. Accordingly, electronics in the optical manifold system can tune the direction of the one or more LIDAR output signals so as to scan the LIDAR output signals to different sample regions in the field of view.

When the tuning provided by the electronics in the optical manifold system is sufficient, a chip constructed according to FIG. 7A and/or FIG. 7B can serve as a scanning head. In these instances, the communication links need not include electrical conductors. However, when the field of view is two dimensional, it may be desirable to be able to scan both vertically and horizontally.

The above head construction is suitable for use with various scanning mechanisms used in LIDAR applications. For instance, the output signal can be received by one or more reflecting devices and/or one more collimating devices. The one or more reflecting devices can be configured to re-direct and/or steer the LIDAR output signal so as to provide scanning of the LIDAR output signal. Suitable reflecting devices include, but are not limited to, mirrors such mechanically driven mirrors and Micro Electro Mechanical System (MEMS) mirrors. The one or more collimating devices provide collimation of the LIDAR output signal and can accordingly increase the portion of the LIDAR input signal that is received by the scanning head. Suitable collimating devices include, but are not limited to, individual lenses and compound lenses.

Figure 8:
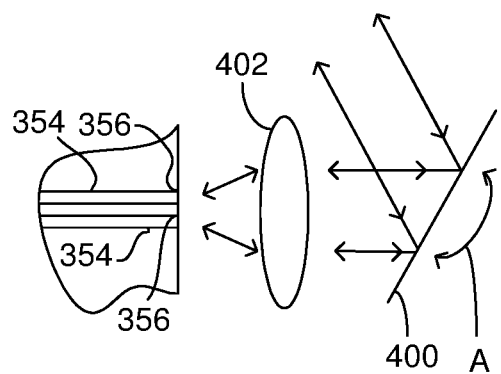
FIG. 8 illustrates a scanning head used with a reflecting device and a collimating device.

FIG. 8 illustrates the above scanning head used with a reflecting device 400 and a collimating device 402. For instance, a lens serves as a collimating device that receives the LIDAR output signal and provides collimation of the LIDAR output signal. A mirror serves as a reflecting device 400 that receives the collimated LIDAR output signal(s) and reflects the collimated LIDAR output signal(s) in the desired direction. As is illustrated by the arrow labeled A, the core electronics can move the mirror so as to steer the collimated LIDAR output signal and/or scan the collimated LIDAR output signal. The movement of the mirror can be in two dimensions or three dimensions. Suitable mirrors include, but are not limited to, mechanically driven mirrors and Micro Electro Mechanical System (MEMS) mirrors.

Figure 9:
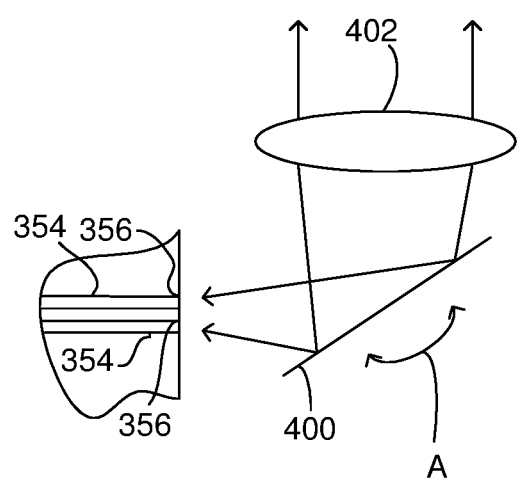
FIG. 9 illustrates another embodiment of a scanning head used with a reflecting device and a collimating device.

FIG. 9 illustrates the above scanning head used with a reflecting device 400 and a collimating device 402. For instance, a mirror serves as a reflecting device 400 that receives the LIDAR output signal and reflects the LIDAR output signal in the desired direction. As is illustrated by the arrow labeled A, the core electronics can move the mirror so as to steer the LIDAR output signal and/or scan the LIDAR output signal. A lens serves as a collimating device 402 that receives the LIDAR output signal from the mirror and provides collimation of the LIDAR output signal. The lens can be configured to move with the movement of the mirror so the lens continues to receive the LIDAR output signal at different positions of the mirror. Alternately, the movement of the mirror can be sufficiently limited that the lens continues to receive the LIDAR output signal at different positions of the mirror. The movement of the mirror can be in two dimensions or three dimensions. Suitable mirrors include, but are not limited to, mechanically driven mirrors and Micro Electro Mechanical System (MEMS) mirrors.

Technologies such as SOI MEMS (Silicon-On-Insulator Micro Electro Mechanical System) technology can be used to incorporate a reflecting device such as a MEMS mirror directly into the chip. For instance, the scanning head of FIG. 7 can be constructed on an optical platform such as a silicon-on-insulator wafer and a MEMS mirror can be incorporated directly into the scanning head.

Figure 10A:
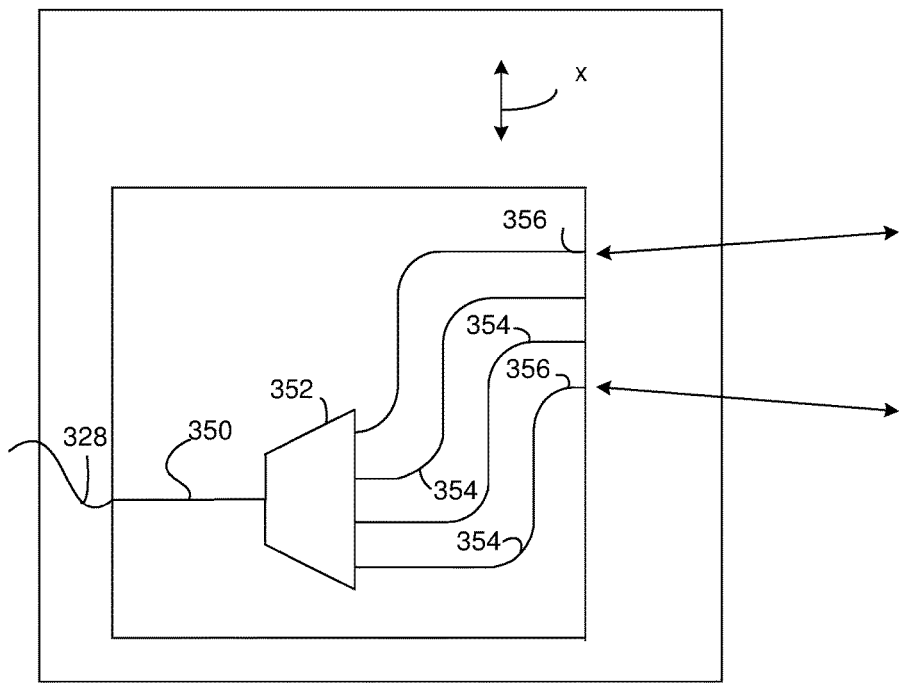
FIG. 10A is a sideview of a steering mechanism.
Figure 10B:
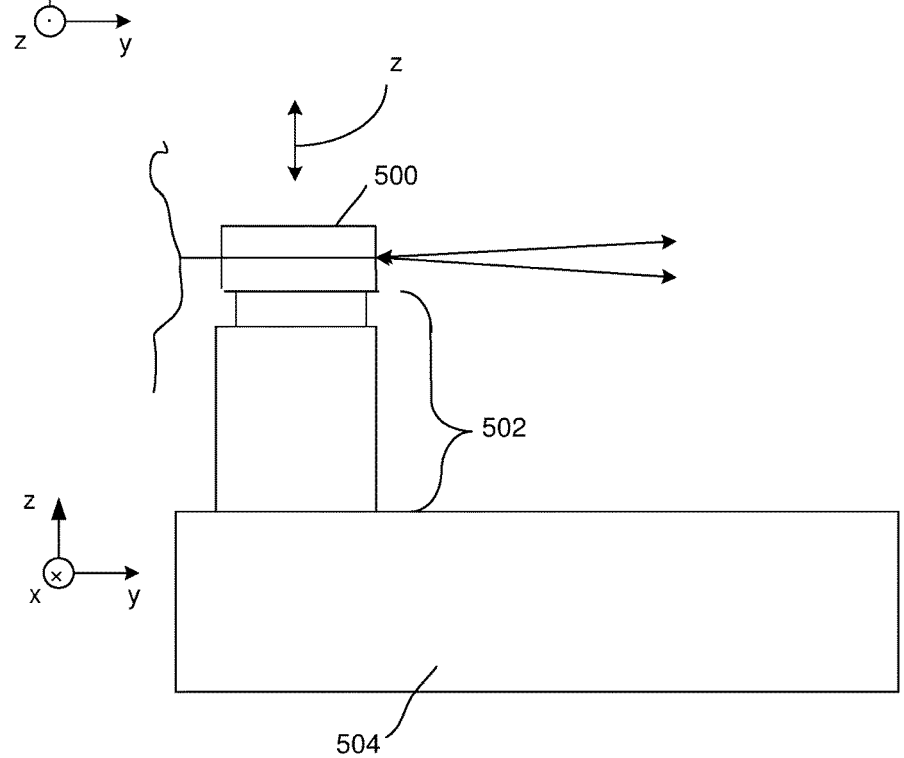
FIG. 10B is a topview of a steering mechanism.

Other beam steering mechanism can be employed to steer the LIDAR output signals in a field of view. An example of a beam steering mechanism is disclosed in FIG. 10A and FIG. 10B. FIG. 10A is a sideview of the steering mechanism and FIG. 10B is a topview of the steering mechanism. The scanning head 500 of FIG. 7 is held by a holder 502 positioned on a stage 504. The line labeled x in FIG. 10A illustrates movement of the scanning head 500 relative to the stage and the line labeled z in FIG. 10B shows movement of the scanning head 500 relative to the stage. The movement in FIG. 10A is in a first plane and the movement in FIG. 10B is in a second plane that is perpendicular to the first plane. The core electronics can use one or both movements to steer the LIDAR output signals from one sample region to the next.

Figure 10C:
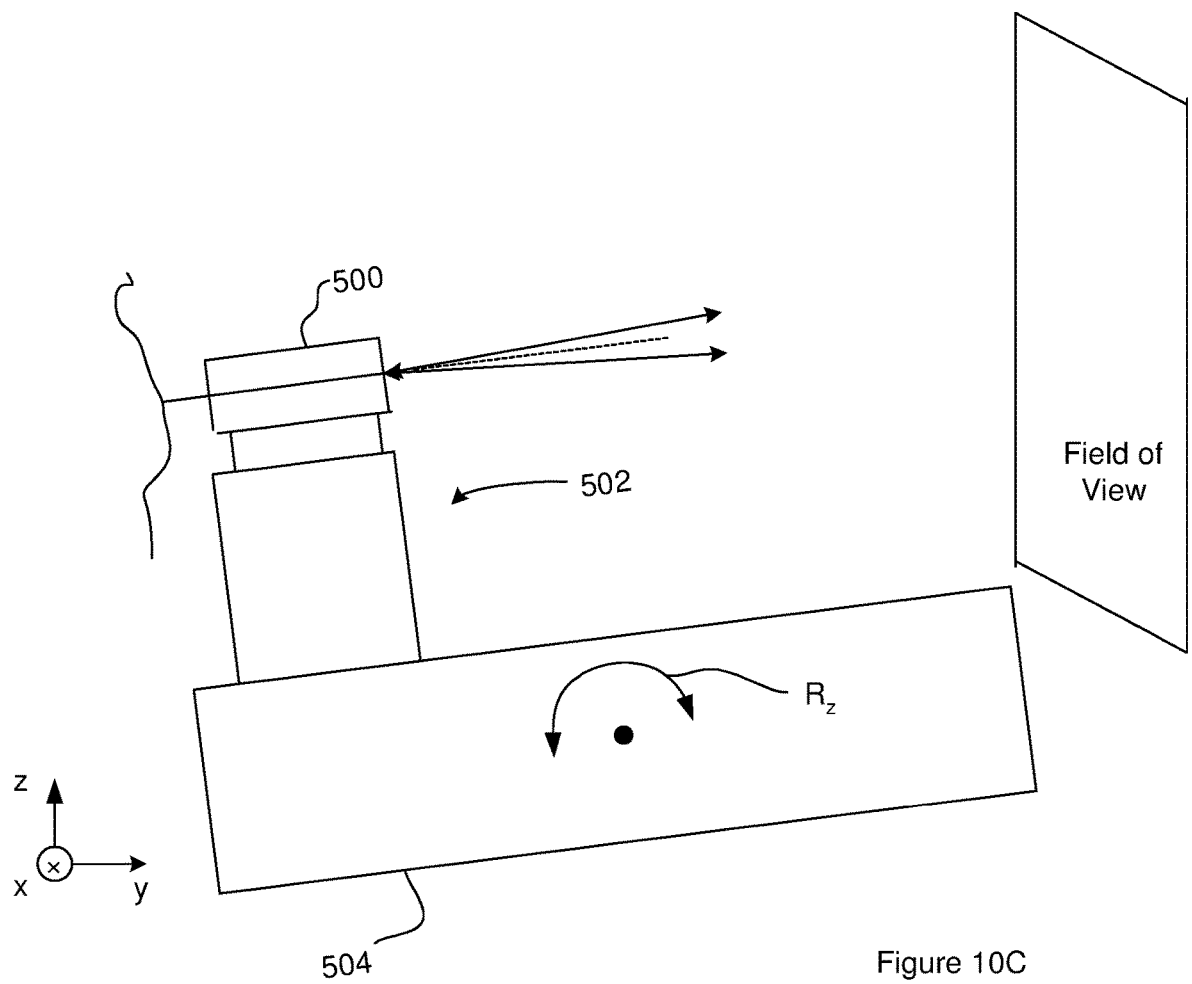
FIG. 10C is a sideview of a steering mechanism with rotational movement.
Figure 10D:
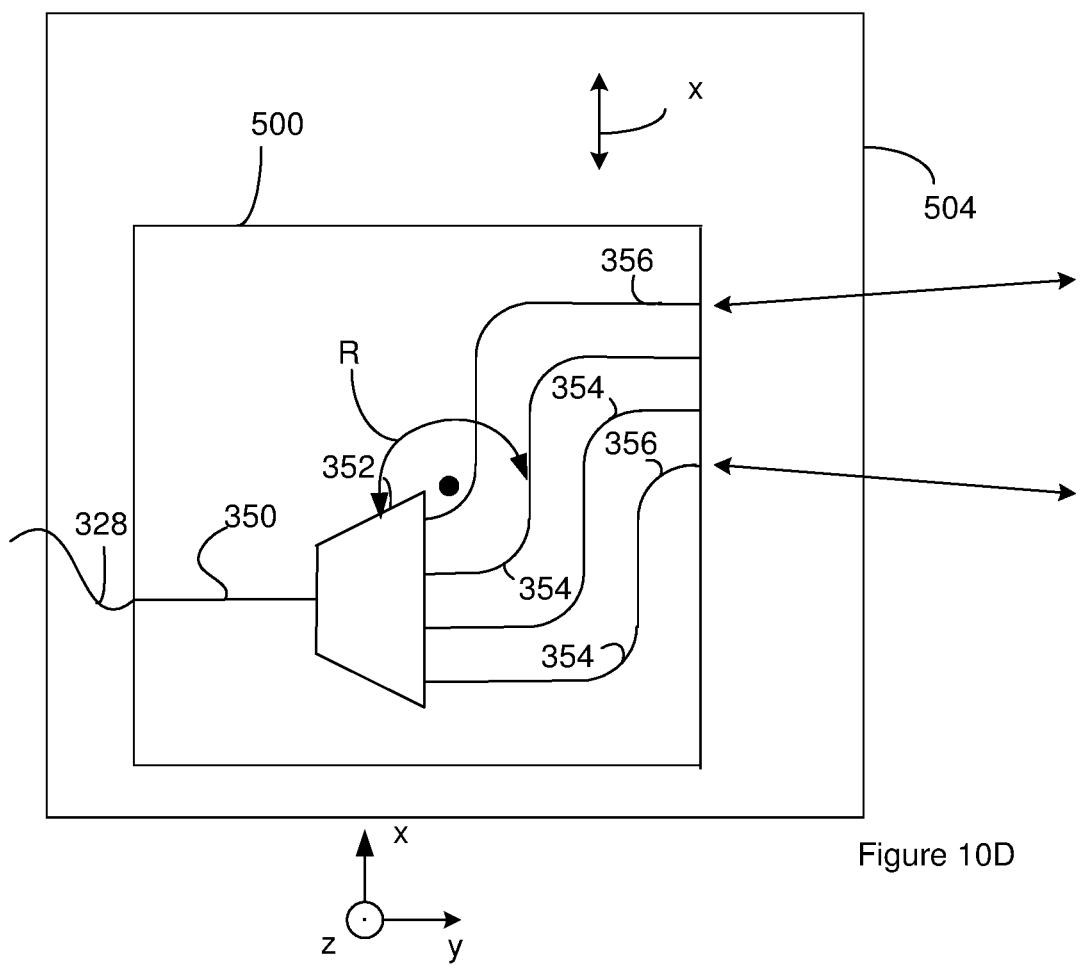
FIG. 10D is a topview of a steering mechanism with rotational movement.

FIG. 10A and FIG. 10B illustrate translation of the scanning head. However, rotational movements are also possible. For instance, the line labeled $R_z$ in FIG. 10C represent rotation of the stage and/or scanning head that provides movement of each of the LIDAR output signals in a first plane. The line labeled R in FIG. 10D represent rotation of the stage and/or scanning head that provides movement of each of the LIDAR output signals in a second plane that is perpendicular to one or more of the first planes. The core electronics can use one or both of these rotational movements to steer the LIDAR output signals from one sample region to the next. Accordingly, the core electronics can use one or more translational movement and/or one or more rotational movements to steer the LIDAR output signals from one sample region to the next.

The translational movement can be provided by actuators (not illustrated) such as linear motion stages like piezo motor driven stages including, but not limited to, the Q-552.030 from PI which provides a maximum linear travel range of 6.5 mm at a speed of 10 mm/s (PI USA, 2018). The rotational movement can be provided by actuators such as the Q622930 Q-Motion Miniature Rotation Stage (PI USA, 2018). The core electronics can control the translational and/or rotational actuators by electrical signals provided to the scanning head over a communications links 328.

Suitable electronics for use as each of the different electronics (core electronics, master electronics, and remote electronics) can include, but are not limited to, a controller that includes or consists of analog electrical circuits, digital electrical circuits, processors, microprocessors, digital signal processors (DSPs), Field Programmable Gate Arrays (FPGAs), computers, microcomputers, or combinations suitable for performing the operation, monitoring and control functions described above. In some instances, the controller has access to a memory that includes instructions to be executed by the controller during performance of the operation, control and monitoring functions. Although the electronics are illustrated as a single component in a single location, the electronics can include multiple different components that are independent of one another and/or placed in different locations. Additionally, as noted above, all or a portion of the disclosed electronics can be included on the chip including electronics that are integrated with the chip.

Other embodiments, combinations and modifications of this invention will occur readily to those of ordinary skill in the art in view of these teachings. Therefore, this invention is to be limited only by the following claims, which include all such embodiments and modifications when viewed in conjunction with the above specification and accompanying drawings.

The invention claimed is:
1. A LIDAR system, comprising:
an optical manifold that includes multiple cores that each generates an outgoing LIDAR signal that carries one or more channels;
scanning heads located apart from the optical manifold and each being associated with one of the cores, the scanning heads configured such that each scanning head receives the outgoing LIDAR signal from the associated core, the scanning heads each being configured to transmit one or more LIDAR output signals that each carries light from a different one of the channels and such that the different LIDAR output signals each travels away from the scanning head in a different direction; and each of the cores being associated with different core electronics,
the core electronics being configured to tune a property of the outgoing LIDAR signal before the outgoing LIDAR signal is output from the associated core,
the tuning of the property causing a change to the direction that the one or more LIDAR output signals travel away from the scanning head associated with the core electronics such that each of the one or more LIDAR output signals is directed to multiple different sample regions,
each of the core electronics being configured to calculate LIDAR data for the sample regions to which the one or more LIDAR output signals is directed, and
the LIDAR data for each of sample regions including at least one component selected from the group consisting of the radial separation between the LIDAR system and an object located outside of the LIDAR system in the sample region and a radial velocity between the LIDAR system and the object located outside of the LIDAR system and in the sample region.

2. The system of claim 1, wherein the property of the outgoing LIDAR signal tuned by the core electronics is the frequency of the outgoing LIDAR signal.

3. The system of claim 1, wherein an optical fiber carries the outgoing LIDAR signal from the manifold to one of the scanning heads.

4. The system of claim 1, wherein the core electronics are located in the manifold.

5. The system of claim 1, wherein each core and the associated core electronics are located on a on a different core card and the core cards are located in the manifold.

6. The system of claim 1, wherein each of the cores includes a different laser cavity that outputs one of the outgoing LIDAR signals; and
wherein the core electronics being configured to tune the property of the outgoing LIDAR signal includes the core electronics tuning a level of electrical current through a gain element included in the laser cavity.

7. The system of claim 1, further comprising:
data electrical links and master electronics, each of the data electrical links carrying LIDAR data from one of the core electronics to the master electronics.

8. The system of claim 7, further comprising:
remote electronics located external to the manifold, the remote electronics receiving the LIDAR data from the master electronics and also processing signals from sensors that are external to the LIDAR system.

9. A LIDAR system, comprising:
an optical manifold that includes a housing in which are positioned multiple cores that each generates an outgoing LIDAR signal that carries one or more channels;
scanning heads located apart from the optical manifold and each being associated with one of the cores, the scanning heads configured such that each scanning head receives an outgoing LIDAR signal from the associated core,
the scanning heads each being configured to transmit one or more LIDAR output signals that each includes light from a different one of the channels and such that the different LIDAR output signals each travels away from the scanning head in a different direction; and the cores each being included on a different core card,
each of the core cards being a printed circuit board,
each of the core cards being connected to a different connector in the housing,
one of the core cards being a first core card that is connected to a first one of the connectors,
the first connector being disconnectable from the first core card such that the scanning head associated with the first core does not receive the outgoing LIDAR signal from the first core,
the outgoing LIDAR signal generated by the core included on the first core card being a first outgoing LIDAR signal; and
a second core card located outside of the housing but configured to be connected to the first connector such that the scanning head associated with the first core receives a second outgoing LIDAR signal from the second core, the second core card having a core configured to generate the second outgoing LIDAR signal and the second outgoing LIDAR signal carrying one or more second channels, the second outgoing LIDAR signal having different optical properties from the first outgoing LIDAR signal.

10. The LIDAR system of claim 9, wherein the difference between the optical properties of the first outgoing LIDAR signal and the second outgoing LIDAR signal includes at least one difference selected from the group consisting of a different number of channels carried by the first outgoing LIDAR signal and the second outgoing LIDAR signal, different channel wavelengths carried by the first outgoing LIDAR signal and the second outgoing LIDAR signal, different channel waveforms carried by the first outgoing LIDAR signal and the second outgoing LIDAR signal, different modulation of the channels carried by the first outgoing LIDAR signal and the second outgoing LIDAR signal, and chirp of the channels carried by the first outgoing LIDAR signal and the second outgoing LIDAR signal.

11. The LIDAR system of claim 9, wherein each of the cores is associated with different core electronics and the core electronics are configured to tune a property of one of the outgoing LIDAR signals such that the tuning of the property causes a change to the direction that the one or more LIDAR output signals travel away from the scanning head associated with the core electronics.

12. The LIDAR system of claim 11, wherein each of the core electronics is configured to generate LIDAR data from the outgoing LIDAR signal generated by the associated core, the LIDAR data including at least one component selected from the group consisting of the radial separation between the LIDAR system and an object located outside of the LIDAR system and a radial velocity between the LIDAR system and an object located outside of the LIDAR system.

13. The LIDAR system of claim 12, wherein the core included on the second core card is configured to generate LIDAR data from the second outgoing LIDAR signal.

14. The system of claim 9, wherein an optical fiber carries the first outgoing LIDAR signal from the manifold to one of the scanning heads.

15. The LIDAR system of claim 14, wherein the first connector is a ferrule connector connected to the optical fiber.

16. A method of operating an optical manifold, comprising:

placing multiple cores in an interior of an optical manifold housing, the cores each configured to generate an outgoing LIDAR signal that carries one or more channels,
  each of the cores being associated with a scanning head located apart from the optical manifold, the scanning heads configured such that each scanning head receives an outgoing LIDAR signal from the associated core,
  one of the cores being a first core; and
physically disconnecting the first core from a connector in the housing and replacing the first core with a second core such that the second core is physically connected the connector, the second core configured to generate a second outgoing LIDAR signal that carries one or more second channels, the second outgoing LIDAR signal having different optical properties from the outgoing LIDAR signal generated by the first core.

17. The method of claim 16, wherein the difference between the optical properties of the first outgoing LIDAR signal and the second outgoing LIDAR signal includes at least one difference selected from the group consisting of a different number of channels carried by the first outgoing LIDAR signal and the second outgoing LIDAR signal, different channel wavelengths carried by the first outgoing LIDAR signal and the second outgoing LIDAR signal, different channel waveforms carried by the first outgoing LIDAR signal and the second outgoing LIDAR signal, different modulation of the channels carried by the first outgoing LIDAR signal and the second outgoing LIDAR signal, and chirp of the channels carried by the first outgoing LIDAR signal and the second outgoing LIDAR signal.

18. The method of claim 16, wherein the connector is an optical fiber connector.

19. The method of claim 18, wherein the optical fiber connector is a ferrule connector.

20. The method of claim 16, wherein the connector is one of multiple connectors in the housing and each of the multiple cores is connected to a different one of the multiple connectors.

* * * * *